United States Patent
Kawashita et al.

(10) Patent No.: US 12,124,062 B2
(45) Date of Patent: Oct. 22, 2024

(54) WAVELENGTH SELECTION FILTER, METHOD OF MANUFACTURING WAVELENGTH SELECTION FILTER, AND DISPLAY DEVICE

(71) Applicant: TOPPAN PRINTING CO., LTD., Tokyo (JP)

(72) Inventors: Masashi Kawashita, Tokyo (JP); Yukari Oda, Tokyo (JP); Yuki Yasu, Tokyo (JP); Yoshiko Ishimaru, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 603 days.

(21) Appl. No.: 17/406,925

(22) Filed: Aug. 19, 2021

(65) Prior Publication Data

US 2021/0382215 A1    Dec. 9, 2021

Related U.S. Application Data

(63) Continuation of application No. PCT/JP2020/007435, filed on Feb. 25, 2020.

(30) Foreign Application Priority Data

Feb. 26, 2019 (JP) .................................. 2019-033025
Feb. 26, 2019 (JP) .................................. 2019-033026

(51) Int. Cl.
*G02B 5/20* (2006.01)
*G02B 5/28* (2006.01)
(Continued)

(52) U.S. Cl.
CPC .............. *G02B 5/203* (2013.01); *G02B 5/201* (2013.01); *G02B 5/28* (2013.01); *G02B 27/12* (2013.01); *H10K 50/858* (2023.02)

(58) Field of Classification Search
CPC .......... G02B 5/203; G02B 5/201; G02B 5/28; G02B 5/1809; G02B 5/1857; G02F 1/133521; H01L 25/0753
See application file for complete search history.

(56) References Cited

U.S. PATENT DOCUMENTS 9,268,070 B2 * 2/2016 Lochbihler .......... G02B 5/1861
9,389,178 B2 * 7/2016 Sugimoto .............. G01N 21/21
(Continued)

FOREIGN PATENT DOCUMENTS

CA        2993901 A1     2/2017
JP      2009-25558 A     2/2009
(Continued)

OTHER PUBLICATIONS

International Searching Authority, "International Search Report," issued in connection with International Patent Application No. PCT/JP2020/007435, dated Jun. 2, 2020, 9 pages.
(Continued)

*Primary Examiner* — Bao-Luan Q Le
(74) *Attorney, Agent, or Firm* — Foley & Lardner LLP

(57) ABSTRACT

A wavelength selection filter includes a first high refractive index section with a thickness T1, a second high refractive index section with a thickness T2, a high refractive index layer with a refractive index n1, a projection-depression structure layer with a refractive index n2, a filling layer with a refractive index n3, a first high refractive index section with an area ratio R1, and a second high refractive index section with an area ratio R2. With $n1>n2$, $n1>n3$, and $R1+R2>1$, the value of $T1\times\{n1\times R1+n2\times(1-R1)\}$ is a first parameter, the value of $T2\times\{n1\times R2+n3\times(1-R2)\}$ is a second parameter, and the ratio of the second parameter to the first parameter is 0.7 or more and 1.3 or less.

7 Claims, 11 Drawing Sheets

(51) Int. Cl.
*G02B 27/12* (2006.01)
*H10K 50/858* (2023.01)

(56) References Cited

U.S. PATENT DOCUMENTS

| | | | | |
|---|---|---|---|---|
| 9,557,461 | B2* | 1/2017 | Lochbihler | G02B 5/203 |
| 10,186,175 | B2* | 1/2019 | Koda | G09F 3/0294 |
| 10,207,533 | B2* | 2/2019 | Lochbihler | B42D 25/355 |
| 10,350,932 | B2* | 7/2019 | Koda | B42D 25/324 |
| 11,097,568 | B2* | 8/2021 | Kawashita | G09F 19/14 |
| 2010/0059663 | A1* | 3/2010 | Desieres | G01J 3/02 359/885 |
| 2010/0091369 | A1* | 4/2010 | Hoose | G02B 5/1857 359/576 |
| 2011/0080640 | A1* | 4/2011 | Kaida | G02B 5/3058 359/485.05 |
| 2012/0235399 | A1* | 9/2012 | Lochbihler | B42D 25/45 283/94 |
| 2014/0085725 | A1* | 3/2014 | Lochbihler | G02B 5/204 359/568 |
| 2014/0253920 | A1* | 9/2014 | Sugimoto | G01N 21/554 356/369 |
| 2014/0321101 | A1 | 10/2014 | Kadowaki | |
| 2015/0070693 | A1* | 3/2015 | Sugimoto | G01N 21/658 356/369 |
| 2015/0219807 | A1* | 8/2015 | Lochbihler | G02B 5/008 359/567 |
| 2015/0253570 | A1 | 9/2015 | Sunnari et al. | |
| 2016/0300535 | A1 | 10/2016 | Gilbert et al. | |
| 2017/0011665 | A1* | 1/2017 | Koda | B42D 25/373 |
| 2017/0326898 | A1* | 11/2017 | Koda | B42D 25/324 |
| 2019/0143736 | A1* | 5/2019 | Kawashita | B42D 25/351 359/567 |

FOREIGN PATENT DOCUMENTS

| | | |
|---|---|---|
| JP | 2011-243963 A | 12/2011 |
| JP | 5023324 B2 | 9/2012 |
| JP | 2013-254093 A | 12/2013 |
| JP | 2017-021322 A | 1/2017 |
| JP | 2018-063305 A | 4/2018 |
| JP | 2018-160646 A | 10/2018 |
| WO | WO-2014/044912 A1 | 3/2014 |
| WO | WO-2015/088900 A1 | 6/2015 |
| WO | WO-2017/021000 A1 | 2/2017 |
| WO | WO-2018/070431 A1 | 4/2018 |

OTHER PUBLICATIONS

International Searching Authority, "Written Opinion," issued in connection with International Patent Application No. PCT/JP2020/007435, dated Jun. 2, 2020, 4 pages.
Office Action issued in corresponding Japanese Patent Application No. 2019-033026, dated Jan. 4, 2023.
Partial Supplementary European Search Report issued in corresponding European Patent Application No. 20762944.5 dated Mar. 17, 2022.
Extended European Search Report issued in connection with EP Appl. Ser. No. 20762944.5 dated Jun. 24, 2022 (18 pages).

* cited by examiner

WAVELENGTH SELECTION FILTER, METHOD OF MANUFACTURING WAVELENGTH SELECTION FILTER, AND DISPLAY DEVICE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/007435, filed on Feb. 25, 2020, which is based upon and claims the benefit of priority to Japanese Patent Application Nos. 2019-033025 and 2019-033026, both filed on Feb. 26, 2019; the disclosures of which are incorporated herein by reference in their entireties.

TECHNICAL FIELD

The present disclosure relates to a wavelength selection filter, a method of manufacturing the wavelength selection filter, and a display device.

BACKGROUND

A wavelength selection filter that uses guided-mode resonance is proposed as a filter for selecting light using an optical phenomenon caused by the microstructure of an object. The wavelength selection filter includes a subwavelength grating which is a diffraction grating having periodicity smaller than the wavelength of light. When light is incident on the subwavelength grating, the diffracted light is less likely to emerge into the space from which the incident light is emitted. Meanwhile, for example, the refractive index difference between the subwavelength grating area and its surroundings causes light in a specific wavelength range to be multiply reflected while propagating. As a result, the light produces resonance and emerges as intense reflected light.

For example, Patent Literature 1 describes a color filter having a structure in which a plurality of projections forming a subwavelength grating are arranged on a substrate. In this structure, however, to increase the intensity of extracted light, that is, to acquire reflected light having high wavelength selectivity, it is desirable to form the substrate from synthetic quartz and to form the projections from silicon, as described in Patent Literature 1, so as to secure a large refractive index difference between the substrate and the projections to thereby reduce losses due to multiple reflection of light. Accordingly, since it is necessary to use a silicon on quartz (SOQ) substrate in which single crystal Si is formed on the substrate made of synthetic quartz, the manufacturing cost increases.

In contrast, Patent Literature 2 describes a wavelength selection element including a waveguide layer between the substrate and the projections forming a subwavelength grating, and the waveguide layer is formed from a material having a refractive index higher than that of a material for the substrate. Even if the projections and the waveguide layer are formed from a resin, the above structure allows light being multiply reflected to propagate into the waveguide layer, thus increasing the wavelength selectivity for reflected light. Furthermore, nanoimprinting may be used as the method of forming the projections and the waveguide layer from resin, which allows a reduction in material costs and enables easy manufacturing, as well as a reduction in manufacturing costs.

[Citation List] [Patent Literature] [PTL 1] JP 5023324 B; [PTL 2] JP 2009-25558 A; [PTL 3] JP 2018-160646 A.

SUMMARY OF THE INVENTION

Technical Problem

In the structure described in Patent Literature 2, however, the mode of light propagation in the waveguide layer depends mainly on the thickness of the waveguide layer and the wavelength of light. Thus, to produce resonance by multiply reflecting light in a desired wavelength range within the waveguide layer, the thickness of the waveguide layer needs to be controlled precisely. The formation of the waveguide layer with a precise thickness in addition to the projections with fine periods will increase the load in manufacturing of the wavelength selection filter. For example, when the projections and the waveguide layer are formed by nanoimprinting, an intaglio plate is pressed into the resin material applied to the substrate to form the projections, and the remaining film part of the resin material between the intaglio plate and the substrate serves as the waveguide layer. It is thus challenging to precisely control the thickness of the waveguide layer. Accordingly, the wavelength selection filter that uses guided-mode resonance still has room for further improvement in the structure to enhance the wavelength selectivity.

Additionally, for example, as described in Patent Literature 3, there is known a display device including a light emitting element which emits blue light and conversion elements which convert the blue light into light other than blue. A red conversion element includes quantum dots that convert blue light into red light, and converts the color of light emitted by the light emitting element into red. A green conversion element includes quantum dots that convert blue light into green light, and converts the color of light emitted by the light emitting element into green. The display device displays a color image using blue light emitted by the light emitting element, red light emitted by the red conversion element, and green light emitted by the green conversion element.

However, the light emitted by conversion elements includes not only converted red light or converted green light, but also some blue light that is transmitted without being converted. Blue light escaping past the red conversion element and blue light escaping past the green conversion element will provide incorrect tints to an image displayed on the display device.

A first object of the present disclosure is to provide a wavelength selection filter capable of increasing the intensity of extracted light, and a method of manufacturing the wavelength selection filter.

A second object of the present disclosure is to provide a display device capable of reducing color mixture in a displayed image.

Solution to Problem

A wavelength selection filter that achieves the above first object includes: a projection-depression structure layer having, on its surface, a projection-depression structure including a plurality of projection-depression elements being projections or depressions, the projection-depression elements being spaced from each other at a subwavelength period and arranged in the form of a two-dimensional lattice; a high refractive index layer positioned on the projection-depression structure and having a surface shape following the projection-depression structure, the high refractive index layer including a first high refractive index section positioned on the bottom of the projection-depression structure and a second high refractive index section positioned on the top of the projection-depression structure; and a filling layer filling the surface projections and depressions of the high refractive index layer. The wavelength selection filter is configured such that $n1>n2$, $n1>n3$, and $R1+R2>1$, a value of $T1\times\{n1\times R1+n2\times(1-R1)\}$ is a first parameter, a value of $T2\times\{n1\times R2+n3\times(1-R2)\}$ is a second parameter, and a ratio of the second parameter to the first parameter is 0.7 or more and 1.3 or less, where T1 is a thickness of the first high refractive index section, T2 is a thickness of the second high refractive index section, n1 is a refractive index of a material of the high refractive index layer, n2 is a refractive index of a material of the projection-depression structure layer, n3 is a refractive index of a material of the filling layer, R1 is an area ratio occupied by the first high refractive index section in a cross section including the first high refractive index section and orthogonal to a thickness direction thereof, and R2 is an area ratio occupied by the second high refractive index section in a cross section including the second high refractive index section and orthogonal to a thickness direction thereof.

According to this configuration, grating regions along a cross section orthogonal to the thickness direction, which are a grating region including the first high refractive index section and a grating region including the second high refractive index section, allow light to produce resonance by guided-mode resonance in wavelength ranges close to each other. Thus, light in close wavelength ranges intensified in the two grating regions is produced as reflected light. Accordingly, compared with a wavelength selection filter having only one grating region, light extracted as reflected light has a high intensity.

A method of manufacturing the wavelength selection filter that achieves the above first object includes: forming a projection-depression structure layer by forming, on the surface of a layer made of a first low refractive index material, projection-depression elements being a plurality of projections or depressions spaced from each other at a subwavelength period and arranged in the form of a two-dimensional lattice; forming, along the surface of the projection-depression structure layer, a high refractive index layer from a high refractive index material higher in refractive index than the first low refractive index material, the high refractive index layer including a first high refractive index section positioned on the bottom of a projection-depression structure included in the projection-depression structure layer and a second high refractive index section positioned on the top of the projection-depression structure; and forming a filling layer by filling the surface projections and depressions of the high refractive index layer by using a second low refractive index material lower in refractive index than the high refractive index material. The wavelength selection filter is configured such that $n1>n2$, $n1>n3$, and $R1+R2>1$, a value of $T1\times\{n1\times R1+n2\times(1-R1)\}$ is a first parameter, a value of $T2\times\{n1\times R2+n3\times(1-R2)\}$ is a second parameter, and each layer is formed such that a ratio of the second parameter to the first parameter is 0.7 or more and 1.3 or less, where T1 is a thickness of the first high refractive index section, T2 is a thickness of the second high refractive index section, n1 is a refractive index of the high refractive index material, n2 is a refractive index of the first low refractive index material, n3 is a refractive index of the second low refractive index material, R1 is an area ratio occupied by the first high refractive index section in a cross section including the first high refractive index section and orthogonal to a thickness direction thereof, and R2 is an area ratio occupied by the second high refractive index section in a cross section including the second high refractive index section and orthogonal to a thickness direction thereof.

The manufacturing method enables manufacturing of a wavelength selection filter that allows light having higher intensity to be extracted as reflected light without precisely controlling the film thickness of the layer in contact with each grating region. Thus, such a wavelength selection filter can be manufactured easily.

A display device that achieves the above second object includes: a light emitting section configured to emit light at a first wavelength; a wavelength conversion section positioned over the light emitting section and configured to use the light at the first wavelength as excitation light to emit light at a second wavelength longer than the first wavelength; and a wavelength selecting section positioned over the wavelength conversion section, the wavelength selecting section having 70% or more reflectance of the light at the first wavelength and 70% or more transmittance of the light at the second wavelength.

According to this configuration, even when light at the second wavelength emitted from the wavelength conversion section and light at the first wavelength emitted from the light emitting section are mixed with each other over the wavelength conversion section, the wavelength selecting section positioned over the wavelength conversion section reflects the light at the first wavelength. This reduces, over the wavelength conversion section, the mixture of the light at the first wavelength into the light emerging to the front of the display device, thus enabling the prevention of color mixture in an image formed by using light emerging through the wavelength selecting section.

Advantageous Effects of the Invention

According to the present disclosure, the wavelength selection filter can increase the intensity of extracted light.

According to the present disclosure, the display device can reduce color mixture in a displayed image.

DETAILED DESCRIPTION

Embodiments of the present invention of will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

First Embodiment

A first embodiment will be described with reference to FIGS. 1 to 12. The first embodiment is an embodiment of a wavelength selection filter and a method of manufacturing the wavelength selection filter. The wavelength selection filter has the function of reflecting or transmitting light in a specific wavelength range to extract light from light incident on the wavelength selection filter. Although the wavelength range to be selected by the wavelength selection filter is not limited to a particular range, the wavelength selection filter may, for example, extract light in a specific wavelength range from light visible to the human naked eye, that is, light in the visible range. Hereinafter, the wavelength of light in the visible range is 400 nm or more and 800 nm or less.

[Overall Configuration of Wavelength Selection Filter]

Figure 1:
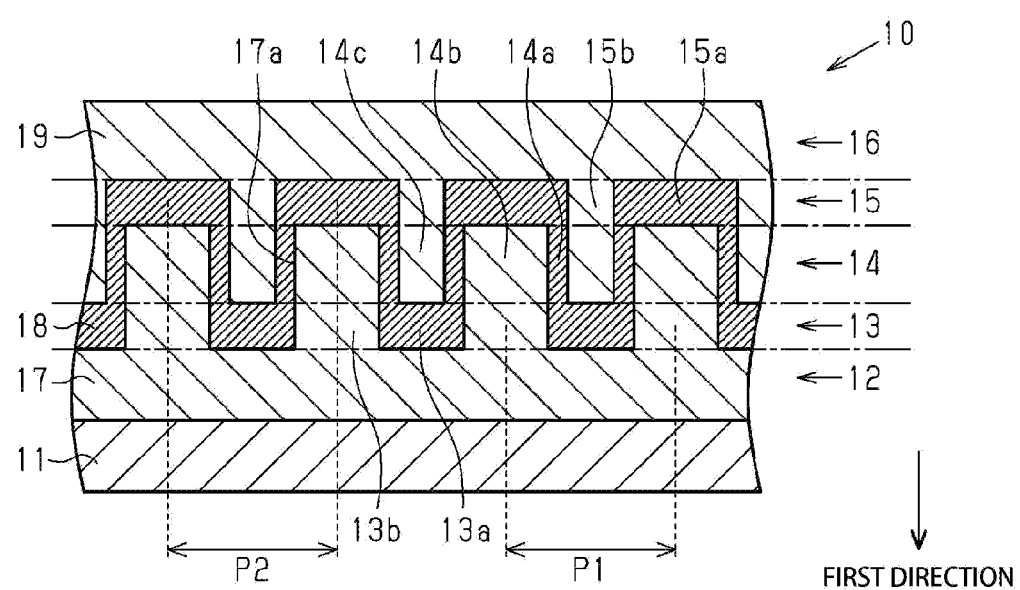
FIG. 1 illustrates a cross-sectional structure of a wavelength selection filter according to a first embodiment.

As shown in FIG. 1, a wavelength selection filter 10 includes a substrate 11, a first low refractive index region 12, a first grating region 13, an intermediate region 14, a second grating region 15, and a second low refractive index region 16. The first low refractive index region 12, the first grating region 13, the intermediate region 14, the second grating region 15, and the second low refractive index region 16 each extend in a layered arrangement and are layered in this order starting from a position close to the substrate 11. The direction in which the regions are layered is a first direction. In other words, the first direction is the thickness direction of each region and of the wavelength selection filter 10. Relative to the substrate 11, the second low refractive index region 16 is positioned at the front side of the wavelength selection filter 10. Relative to the second low refractive index region 16, the substrate 11 is positioned at the rear side of the wavelength selection filter 10.

The substrate 11 has the shape of a plate, and the surface of the substrate 11 which is positioned at the front side of the wavelength selection filter 10 is the front surface of the substrate 11. For the wavelength selection filter 10 that is to select light in the visible range, the substrate 11 may be, for example, a synthetic quartz substrate or a film formed from a resin such as polyethylene terephthalate or polyethylene naphthalate.

The first low refractive index region 12 is in contact with the front surface of the substrate 11 and extends across the front surface of the substrate 11. The first grating region 13 has a first high refractive index section 13a and a first low refractive index section 13b. As viewed in a direction facing the front surface of the substrate 11, that is, a direction along the first direction, a plurality of first low refractive index sections 13b are arranged in the form of a two-dimensional lattice, with the first high refractive index section 13a filling the space between the plurality of first low refractive index sections 13b.

The intermediate region 14 has a side high refractive index section 14a, an isolated low refractive index section 14b, and a peripheral low refractive index section 14c. As viewed in a direction along the first direction, a plurality of isolated low refractive index sections 14b are arranged in the form of a two-dimensional lattice, with each isolated low refractive index section 14b surrounded by the corresponding side high refractive index section 14a. The space between the plurality of side high refractive index sections 14a is filled with the peripheral low refractive index section 14c. The isolated low refractive index sections 14b are positioned above the first low refractive index sections 13b. The side high refractive index sections 14a are positioned at the end portions in the width direction of the first high refractive index section 13a, and the peripheral low refractive index section 14c is positioned above the cross-direction center of the first high refractive index section 13a.

The second grating region 15 has a second high refractive index section 15a and a second low refractive index section 15b. As viewed in a direction along the first direction, a plurality of second high refractive index sections 15a are arranged in the form of a two-dimensional lattice, with the second low refractive index section 15b filling the space between the plurality of second high refractive index sections 15a. The second high refractive index sections 15a are positioned above the isolated low refractive index sections 14b and the side high refractive index sections 14a, whereas the second low refractive index section 15b is positioned above the peripheral low refractive index section 14c.

The second low refractive index region 16 covers the second grating region 15 on the side of the second grating region 15 opposite to the intermediate region 14.

Of the above-described regions forming the wavelength selection filter 10, regions adjacent to each other in the first direction have parts connected to each other. More specifically, the first low refractive index region 12 and the first low refractive index sections 13b are continuous with each other, and the first low refractive index sections 13b and the isolated low refractive index sections 14b are continuous with each other, and these regions are formed from the same material. The first high refractive index section 13a and the side high refractive index sections 14a are continuous with each other, and the side high refractive index sections 14a and the second high refractive index sections 15a are continuous with each other, and these regions are formed from the same material. The peripheral low refractive index section 14c and the second low refractive index section 15b are continuous with each other, and the second low refractive index section 15b and the second low refractive index region 16 are continuous with each other, and these regions are formed from the same material.

In other words, the wavelength selection filter 10 may be regarded as a structure including the substrate 11, a projection-depression structure layer 17 positioned on the substrate 11 and including a surface projection-depression structure formed of a plurality of projections 17a arranged in the form of a two-dimensional lattice, a high refractive index layer 18 placed along the surface of the projection-depression structure layer 17 and having a surface shape following the projection-depression structure, and a filling layer 19 filling the surface projections and depressions of the high refractive index layer 18.

The projection-depression structure layer 17 includes the first low refractive index region 12, the first low refractive index sections 13b, and the isolated low refractive index sections 14b. The projections 17a include the first low refractive index sections 13b and the isolated low refractive index sections 14b.

The high refractive index layer 18 includes the first high refractive index section 13a, the side high refractive index sections 14a, and the second high refractive index sections 15a. The first high refractive index section 13a is positioned between the plurality of projections 17a, that is, at the bottom of the projection-depression structure. The side high refractive index sections 14a are in contact with the side surfaces of the projections 17a, and extend in the thickness direction of the intermediate region 14 in a manner to connect the borders of the first high refractive index section 13a and the second high refractive index sections 15a adjacent to each other as viewed in a direction along the first direction. The second high refractive index sections 15a cover the top surfaces of the projections 17a, that is, lie on top of the projection-depression structure.

The filling layer 19 includes the peripheral low refractive index section 14c, the second low refractive index section 15b, and the second low refractive index region 16, with the peripheral low refractive index section 14c and the second low refractive index section 15b protruding from the second low refractive index region 16 toward the substrate 11.

The material for the high refractive index layer 18 has a refractive index higher than the refractive index of the material for each of the projection-depression structure layer 17 and the filling layer 19. More specifically, the refractive index of each of the first high refractive index section 13a, the side high refractive index sections 14a, and the second high refractive index sections 15a is higher than the refractive index of each of the first low refractive index region 12, the first low refractive index sections 13b, the isolated low refractive index sections 14b, the peripheral low refractive index section 14c, the second low refractive index section 15b, and the second low refractive index region 16. The projection-depression structure layer 17 and the filling layer 19 may be formed from the same material or different materials.

For the wavelength selection filter 10 that is to select light in the visible range, the low refractive index material for the projection-depression structure layer 17 and the filling layer 19 may be an inorganic material such as synthetic quartz or a resin material such as an ultraviolet-curing resin, a thermoplastic resin or a thermosetting resin. In this case, the high refractive index material for the high refractive index layer 18 may be an inorganic compound material such as TiO2 (titanium oxide), Nb2O5 (niobium oxide), Ta2O5 (tantalum oxide), ZrO (zirconium oxide), ZnS (zinc sulfide), ITO (indium tin oxide), or AlN (aluminum nitride).

[Effect of Wavelength Selection Filter]

The first grating region 13 has a grating structure, the period of which, or the period of the arrangement of the first low refractive index sections 13b of which, is referred to as a first period P1. The first period P1 is smaller than the wavelength of light in the visible range. Similarly, the second grating region 15 has a grating structure, the period of which, or the period of the arrangement of the second high refractive index sections 15a of which, is referred to as a second period P2. The second period P2 is smaller than the wavelength of light in the visible range. In other words, the first period P1 and the second period P2 are subwavelength periods, and the first grating region 13 and the second grating region 15 each include a subwavelength grating.

In the wavelength selection filter 10, each region has an average refractive index approximated to a value obtained by averaging the refractive index of the high refractive index section and the refractive index of the low refractive index section in the region in accordance with the volume ratio between the high refractive index section and the low refractive index section. The proportion of the side high refractive index sections 14a in the intermediate region 14 is smaller than the proportion of the first high refractive index section 13a in the first grating region 13 and the proportion of the second high refractive index sections 15a in the second grating region 15. Accordingly, the intermediate region 14 has an average refractive index smaller than each of the average refractive index of the first grating region 13 and the average refractive index of the second grating region 15. That is, the wavelength selection filter 10 has a structure in which the subwavelength grating in each of the first grating region 13 and the second grating region 15 is embedded in the low refractive index region.

When light is incident on the wavelength selection filter 10 from the front side of the wavelength selection filter 10, the subwavelength grating of the second grating region 15 embedded in the low refractive index region prevents the emergence of diffracted light to the front side of the second grating region 15, causing guided-mode resonance. That is, light in a specific wavelength range propagates while being multiply reflected in the second grating region 15 and produces resonance. The light in the specific wavelength range emerges as reflected light from the front side of the wavelength selection filter 10.

The light passing through the second grating region 15 and also the intermediate region 14 enters the first grating region 13. When light is incident on the first grating region 13, the subwavelength grating of the first grating region 13 embedded in the low refractive index region causes guided-mode resonance also in the first grating region 13. That is, light in a specific wavelength range propagates while being multiply reflected in the first grating region 13 and produces resonance. The light in the specific wavelength range emerges as reflected light from the front side of the wavelength selection filter 10.

The light passing through the first grating region 13 passes through the first low refractive index region 12 and the substrate 11, and emerges from the rear surface of the wavelength selection filter 10.

As a result, the light in the wavelength range intensified in the second grating region 15 and the light in the wavelength range intensified in the first grating region 13 emerge from the front side of the wavelength selection filter 10. Meanwhile, the light in the wavelength range of the light incident on the wavelength selection filter 10, except the wavelength range of the emerging reflected light, emerges as transmitted light from the rear side of the wavelength selection filter 10.

In the case in which light is incident on the wavelength selection filter 10 from the rear side of the wavelength selection filter 10, the reflected light in the wavelength range intensified in the second grating region 15 and the reflected light in the wavelength range intensified in the first grating region 13 emerge from the rear side of the wavelength selection filter 10. Meanwhile, the light in the wavelength range of the incident light, except the wavelength range of the emerging reflected light, emerges as transmitted light from the front side of the wavelength selection filter 10.

[Detailed Mechanism of Wavelength Selection Filter]

The mechanism of the above wavelength selection filter 10 for enhancing the wavelength selectivity, that is, increasing the intensity of reflected light in a specific wavelength range, will now be described.

In the wavelength selection filter 10, if the wavelength range of light that produces resonance in the first grating region 13 is the same as the wavelength range of light that produces resonance in the second grating region 15, the light in the wavelength range of the reflected light emerging from the wavelength selection filter 10 has a higher intensity, resulting in an increase in the reflected light wavelength selectivity.

For example, light in a specific wavelength range may produce resonance in the second grating region 15 with a small refractive index difference between the second grating region 15 and the intermediate region 14. In this case, each time the light in the specific wavelength range reflects in the second grating region 15, the light partially leaks out into the intermediate region 14. However, with the first grating region 13 and the second grating region 15 having the same wavelength range in which light produces resonance, the light in the specific wavelength range leaking out into the intermediate region 14 will enter the first grating region 13, produce resonance, and emerge as reflected light. Accordingly, compared with a wavelength selection filter having only one grating region, light in the specific wavelength range of reflected light emerging from the wavelength selection filter 10 has a high intensity, resulting in an increase in the wavelength selectivity for reflected light.

For light to produce resonance in the same wavelength range in the first grating region 13 and the second grating region 15, the first grating region 13 and the second grating region 15 may have the same optical film thickness, which is a parameter represented as a value obtained by multiplying an average refractive index by a film thickness. More specifically, the first grating region 13 and the second grating region 15 having closer optical film thicknesses allow light to produce resonance in closer wavelength ranges, and have a higher reflected light wavelength selectivity. The present inventors have performed simulations on the optical film thickness ratio between the first grating region 13 and the second grating region 15, and found the range of optical film thickness ratios that provides good wavelength selectivity for reflected light. This will be described in detail below.

Figure 2A:
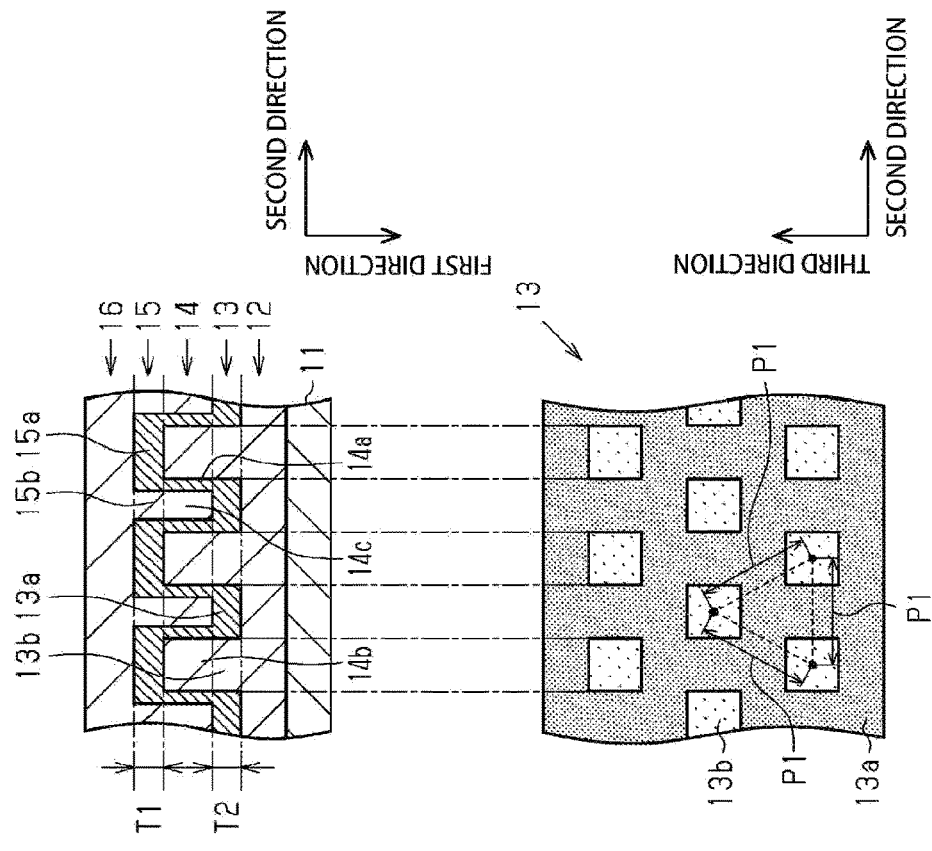
FIG. 2A illustrates a cross-sectional structure of a first grating region in the wavelength selection filter according to the first embodiment, together with the cross-sectional structure of the wavelength selection filter.
Figure 2B:
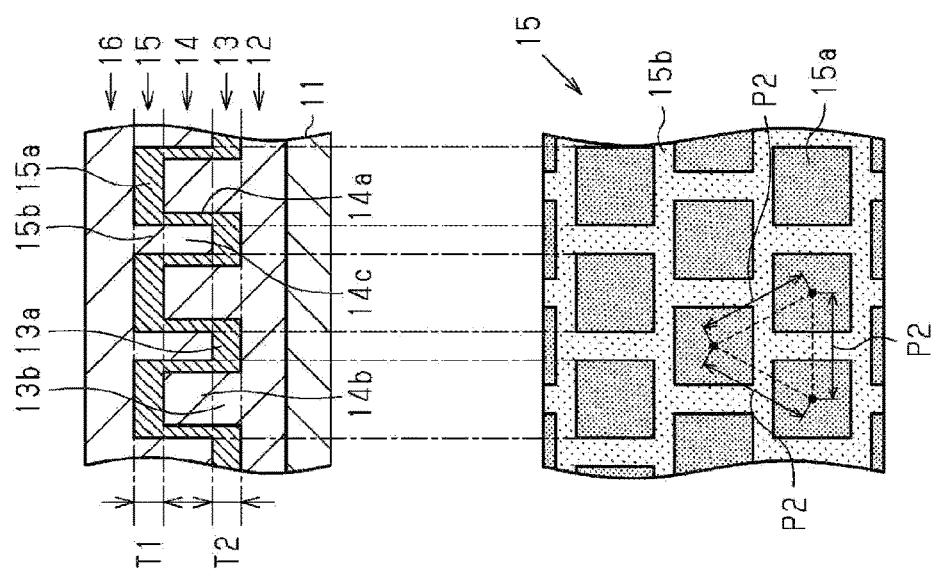
FIG. 2B illustrates a cross-sectional structure of a second grating region in the wavelength selection filter according to the first embodiment, together with the cross-sectional structure of the wavelength selection filter.

FIG. 2A illustrates a cross section of the first grating region 13 orthogonal to the first direction, together with the cross section of the wavelength selection filter 10, and FIG. 2B illustrates a cross section of the second grating region 15 orthogonal to the first direction, together with the cross section of the wavelength selection filter 10. The second direction and the third direction are directions along the front surface of the substrate 11, and each of the second direction and the third direction is orthogonal to the first direction. The second direction and the third direction are orthogonal to each other.

As shown in FIG. 2A, the first low refractive index sections 13b in the first grating region 13 are arranged in the form of a two-dimensional lattice. The two-dimensional lattice may be of any type in which the first low refractive index sections 13b are positioned at the lattice points of a lattice formed by crossing two parallel line groups extending in different directions. For example, the two-dimensional lattice formed by the first low refractive index sections 13b may be a tetragonal lattice or a hexagonal lattice. The first period P1, which is the period of the grating structure of the first grating region 13, is the same in each direction in which the two-dimensional lattice extends.

As viewed in a direction along the first direction, although the first low refractive index sections 13b are not limited to a particular shape, for example, the first low refractive index sections 13b that are square will facilitate the setting of the volume ratio which defines the average refractive index of the first grating region 13.

The volume ratio of the first high refractive index section 13a to the whole first grating region 13 is equal to the area ratio of the first high refractive index section 13a to the whole first grating region 13 in a plan view as seen in a direction along the first direction. The area ratio is, in other words, the ratio of the area occupied by the first high refractive index section 13a in a cross section including the first high refractive index section 13a and orthogonal to the thickness direction. When the area of the first high refractive index section 13a varies depending on the position of the cross section, the area ratio of the first high refractive index section 13a at the cross section where the area of the first high refractive index section 13a is the maximum is adopted.

When the area ratio of the first high refractive index section 13a is denoted by R1, the area ratio of the first low refractive index sections 13b in the cross section is expressed as 1−R1.

When the material for the high refractive index layer 18 has a refractive index of n1, and the material for the projection-depression structure layer 17 has a refractive index of n2 (n1>n2), the first grating region 13 has an average refractive index NA1 expressed by equation (1) below.

$$NA1 = n1 \times R1 + n2 \times (1-R1) \tag{1}$$

The first grating region 13 has an optical film thickness OT1 (a first parameter) expressed by equation (2) below using the average refractive index NA1 and the thickness T1 of the first grating region 13.

$$OT1 = T1 \times NA1 = T1 \times \{n1 \times R1 + n2 \times (1 - R1)\} \tag{2}$$

As shown in FIG. 2B, the second high refractive index sections 15a in the second grating region 15 are arranged in the form of a two-dimensional lattice corresponding to the first grating region 13. The second period P2, which is the period of the grating structure of the second grating region 15, is the same as the first period P1 of the first grating region 13.

However, as viewed in a direction along the first direction, the second high refractive index sections 15a over the second grating region 15 are larger than the first low refractive index sections 13b over the first grating region 13. In other words, the second high refractive index sections 15a are wider than the first low refractive index sections 13b in each of the second direction and the third direction. Accordingly, the second low refractive index section 15b is narrower than the first high refractive index section 13a. As viewed in a direction along the first direction, the second high refractive index sections 15a have a shape similar to the shape of the first low refractive index sections 13b.

The volume ratio of the second high refractive index sections 15a to the whole second grating region 15 is equal to the area ratio of the second high refractive index sections 15a to the whole second grating region 15 in a plan view as seen in a direction along the first direction. The area ratio is, in other words, the ratio of the area occupied by the second high refractive index sections 15a in a cross section including the second high refractive index sections 15a and orthogonal to the thickness direction. When the area of the second high refractive index sections 15a varies depending on the position of the cross section, the area ratio of the second high refractive index sections 15a at the cross section where the area of the second high refractive index sections 15a is the maximum is adopted.

When the area ratio of the second high refractive index sections 15a is denoted by R2, the area ratio of the second low refractive index section 15b in the cross section is expressed as 1−R2.

When the material for the high refractive index layer 18 has a refractive index of n1, and the material for the filling layer 19 has a refractive index of n3 (n1>n3), the second grating region 15 has an average refractive index NA2 expressed by equation (3) below.

$$NA2 = n1 \times R2 + n3 \times (1-R2) \tag{3}$$

The second grating region 15 has an optical film thickness OT2 (a second parameter) expressed by equation (4) below using the average refractive index NA2 and the thickness T2 of the second grating region 15.

$$OT2 = T2 \times NA2 = T2 \times \{n1 \times R2 + n3 \times (1 - R2)\} \tag{4}$$

It has been confirmed that if the ratio of the optical film thickness OT2 of the second grating region 15 to the optical film thickness OT1 of the first grating region 13 (OT2/OT1) is 0.7 or more and 1.3 or less, the wavelength selection filter 10 has good wavelength selectivity for reflected light.

In particular, under the condition that the thickness T1 of the first grating region 13 is equal to the thickness T2 of the second grating region 15, and the refractive index n2 of the material for the projection-depression structure layer 17 is equal to the refractive index n3 of the material for the filling layer 19, it is preferable that the area ratio R1 of the first high refractive index section 13a be equal to the area ratio R2 of the second high refractive index sections 15a because the optical film thickness OT1 matches the optical film thickness OT2.

As described above, the second high refractive index sections 15a are larger than the first low refractive index sections 13b as viewed in a direction along the first direction. Thus, in the present embodiment, for the area ratio R1 of the first high refractive index sections 13a and the area ratio R2 of the second high refractive index sections 15a to be closer to each other, the first low refractive index sections 13b in the first grating region 13 have an area ratio smaller than the area ratio of the first high refractive index section 13a, whereas the second high refractive index sections 15a in the second grating region 15 have an area ratio greater than the area ratio of the second low refractive index section 15b. Consequently, the area ratio R1 of the first high refractive index sections 13a and the area ratio R2 of the second high refractive index sections 15a are each greater than 0.5, and R1+R2 is greater than 1.

With the area ratios R1 and R2 greater than 0.5, each of the grating regions 13 and 15 has an average refractive index greater than in a structure with its area ratios R1 and R2 being 0.5 or less, thus widening the difference between the average refractive index of each of the grating regions 13 and 15, and the average refractive index of each of the regions 12, 14, and 16 adjacent to the regions 13 and 15. This reduces losses due to multiple reflection caused in each of the grating regions 13 and 15, and thus increases the intensity of reflected light emerging from the grating regions 13 and 15.

Figure 3:
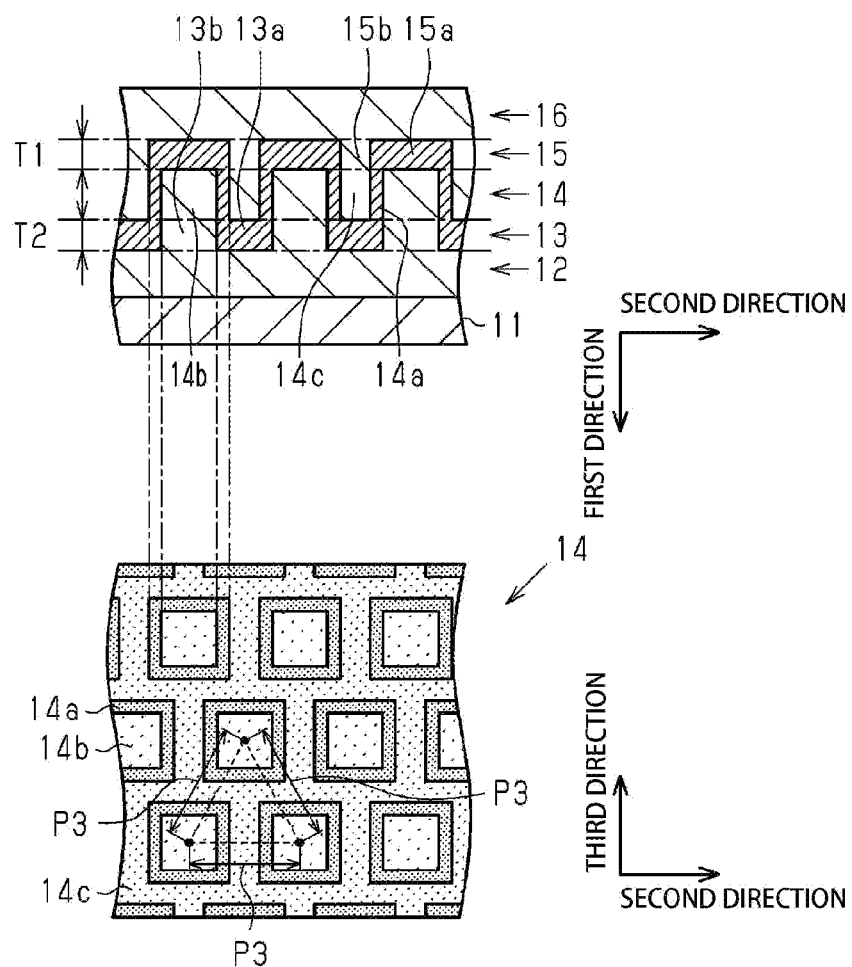
FIG. 3 illustrates a cross-sectional structure of an intermediate region in the wavelength selection filter according to the first embodiment, together with the cross-sectional structure of the wavelength selection filter.

FIG. 3 illustrates a cross section of the intermediate region 14 orthogonal to the first direction, together with the cross section of the wavelength selection filter 10. As shown in FIG. 3, the plurality of isolated low refractive index sections 14b in the intermediate region 14 are arranged in the form of a two-dimensional lattice corresponding to the first grating region 13. The isolated low refractive index sections 14b in the intermediate region 14 have an arrangement period referred to as a third period P3, which is the same as the first period P1 of the first grating region 13. As viewed in a direction along the first direction, the isolated low refractive index sections 14b are equal in size to the first low refractive index sections 13b. Each side high refractive index section 14a surrounds one isolated low refractive index section 14b, and the peripheral low refractive index section 14c fills the gap between adjacent side high refractive index sections 14a.

In a plan view as seen in a direction along the first direction, the area ratio of the side high refractive index sections 14a to the whole intermediate region 14 is preferably equal to or less than the difference between the area ratio of the second high refractive index sections 15a and the area ratio of the first low refractive index sections 13b. That is, when the area ratio of the side high refractive index sections 14a is denoted by R3, R3 preferably satisfies equation (5) below. The area ratio of the side high refractive index sections 14a is, in other words, the ratio of the area occupied by the side high refractive index sections 14a in a cross section including the side high refractive index sections 14a and orthogonal to the thickness direction. When the area of the side high refractive index sections 14a varies depending on the position of the cross section, the area ratio of the side high refractive index sections 14a at the cross section where the area of the side high refractive index sections 14a is the maximum is adopted.

$$R3 \leq R2-(1-R1)=R1+R2-1 \qquad (5)$$

When equation (5) is satisfied, as viewed in a direction along the first direction, the second high refractive index sections 15a extend beyond the isolated low refractive index sections 14b and the side high refractive index sections 14a. More specifically, as viewed in a direction along the first direction, if the area occupied by each second high refractive index section 15a is equal to the area occupied by each isolated low refractive index section 14b and the side high refractive index section 14a, the area ratio R3 of the side high refractive index sections 14a is equal to the right side, and is R1+R2−1. As viewed in a direction along the first direction, if the area occupied by each second high refractive index section 15a is larger than the area occupied by each isolated low refractive index section 14b and the side high refractive index section 14a, or if the side high refractive index section 14a is situated within the perimeter of the second high refractive index section 15a, the area ratio R3 is smaller than R1+R2−1.

As described above, to increase the intensity of reflected light emerging from each of the grating regions 13 and 15 using guided-mode resonance, it is desirable to widen the difference between the average refractive index of each of the grating regions 13 and 15, and the average refractive index of each of the regions 12, 14, and 16 sandwiching the grating regions 13 and 15. Accordingly, the intermediate region 14 preferably has the smallest possible average refractive index, that is, the side high refractive index sections 14a preferably have the smallest possible area ratio. If equation (5) is satisfied, the width of each side high refractive index section 14a does not exceed that of the second high refractive index section 15a, and thus the area ratio of the side high refractive index sections 14a is not excessive. Consequently, reflected light from each of the grating regions 13 and 15 has good intensity.

To increase the intensity of the reflected light, it is preferable that the difference between the average refractive index of the first grating region 13, and the average refractive index of each of the first low refractive index region 12 and the intermediate region 14, be greater than 0.1. Similarly, it is preferable that the difference of the average refractive index of the second grating region 15, and the average refractive index of each of the intermediate region 14 and the second low refractive index region 16, be greater than 0.1.

Although the elements forming each subwavelength grating in the present embodiment are arranged in the form of a two-dimensional lattice, the elements forming the subwavelength grating may, for example, have a strip shape extending in the second direction or the third direction. Such an arrangement can also produce guided-mode resonance. However, in a grating region including such elements extending in one direction, only light polarized in a particular direction which depends on the arrangement direction of the elements will be multiply reflected to produce resonance, and emerge as reflected light. In contrast, the elements arranged in the form of a two-dimensional lattice as in the present embodiment allow light polarized in different directions to produce resonance. Accordingly, reflected light emerges efficiently in response to incident light including components of polarization in various directions, so that the reflected light has higher intensity.

In particular, the elements arranged in the form of a hexagonal lattice will allow each grating region to have more directions in which polarized light can produce resonance than the elements arranged in the form of a tetragonal lattice. Thus, reflected light can emerge more efficiently in response to incident light containing polarization components in various directions.

[Method of Manufacturing Wavelength Selection Filter]

A method of manufacturing the wavelength selection filter 10 will now be described with reference to FIGS. 4 to 6.

Figure 4:
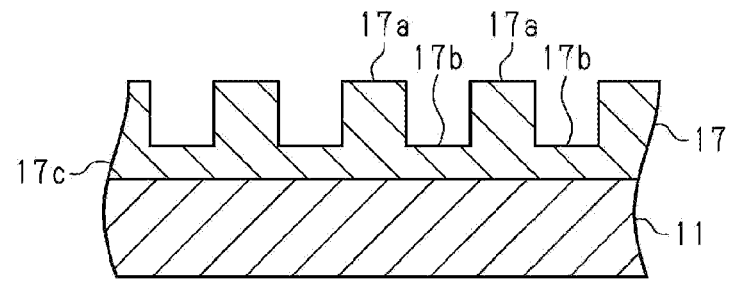
FIG. 4 illustrates a step of forming a projection-depression structure layer in a method of manufacturing the wavelength selection filter according to the first embodiment.

As shown in FIG. 4, a low refractive index material layer is first formed on the front surface of the substrate 11, and a projection-depression structure is formed in the front surface of this layer to make the projection-depression structure layer 17. The projection-depression structure layer 17 includes a flat section 17c extending across the substrate 11, the plurality of projections 17a protruding from the flat section 17c, and a plurality of depressions 17b between the projections 17a. The projections 17a are spaced from each other, and the depressions 17b form one continuous depression area.

The projection-depression structure may be formed by a known micromachining technique such as nanoimprinting or dry etching. In particular, nanoimprinting is preferable because it enables fine projections 17a and depressions 17b to be formed easily.

For example, to form the projection-depression structure layer 17 by photo-nanoimprinting using an ultraviolet-curing resin as the low refractive index material, the ultraviolet-curing resin is first applied to the front surface of the substrate 11. Then, a synthetic quartz mold serving as an intaglio plate having the inverted projections and depressions corresponding to the projections 17a and the depressions 17b to be formed is pressed against the surface of the applied layer of the ultraviolet-curing resin, and the applied layer and the intaglio plate are irradiated with ultraviolet radiation. Subsequently, the UV-cured resin is released from the intaglio plate. As a result, the projections and depressions of the intaglio plate are transferred to the UV-cured resin to form the projections 17a and the depressions 17b, and the flat section 17c is formed between the substrate 11 and the projections 17a and depressions 17b as the remaining film of the UV-cured resin.

Figure 5:
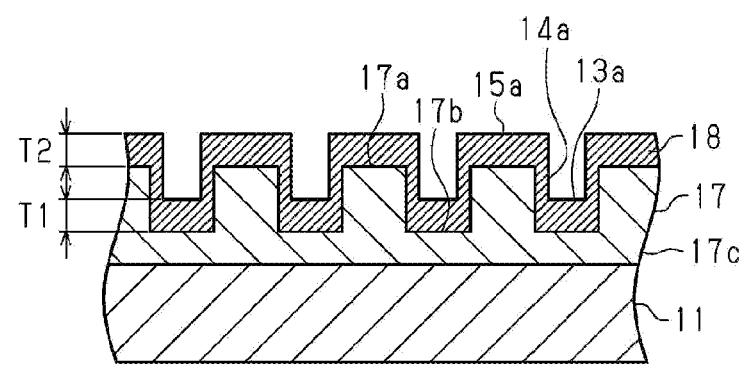
FIG. 5 illustrates a step of forming a high refractive index layer in the method of manufacturing the wavelength selection filter according to the first embodiment.

Next, as shown in FIG. 5, the high refractive index layer 18 made from a high refractive index material is formed on the surface of the projection-depression structure layer 17. The high refractive index layer 18 may be formed by a known film formation technique such as a vacuum deposition method or a sputtering process. The high refractive index layer 18 has a thickness smaller than the height of the projections 17a and is determined in accordance with the desired thicknesses T1 and T2.

When the high refractive index layer 18 is formed using physical vapor deposition including a vacuum deposition method or a sputtering process, a film is formed on the projections 17a of the projection-depression structure layer 17 in a manner to extend beyond the projections 17a. More specifically, the second high refractive index sections 15a are formed wider than the first low refractive index sections 13b and the isolated low refractive index sections 14b, both serving as the projections 17a. Thus, in physical vapor deposition, even if the projections 17a and the depressions 17b in the surface of the projection-depression structure layer 17 have an area ratio of one to one, the area ratio of the first high refractive index section 13a will differ from the area ratio of the second high refractive index sections 15a.

Furthermore, as the second high refractive index sections 15a widen during the film forming process, the particles of the vapor deposition material become less likely to adhere to the depressions 17b, so that the thickness T1 of the first high refractive index section 13a may differ from the thickness T2 of the second high refractive index sections 15a.

It is desirable to correct the difference between the area ratios or the thicknesses caused by the widening of the second high refractive index sections 15a as well as set the area ratio between the projections 17a and the depressions 17b so that the ratio of the optical film thickness OT2 to the optical film thickness OT1 is 0.7 or more and 1.3 or less. With the projections 17a arranged in the form of a two-dimensional lattice as in the present embodiment, the size and the arrangement of the projections 17a are highly flexible, facilitating fine adjustments for determination of the area ratio between the projections 17a and the depressions 17b.

When the high refractive index layer 18 is formed using physical vapor deposition, the high refractive index material often adheres to the side surfaces of the projections 17a of the projection-depression structure layer 17, and the side high refractive index sections 14a are inevitably formed. Thus, as described above, the width of the side high refractive index sections 14a are controlled so as to satisfy equation (5). As a result, even a manufacturing method that involves the formation of the side high refractive index sections 14a allows reflected light from each of the grating regions 13 and 15 to have good intensity.

The width of the side high refractive index sections 14a can be controlled in accordance with the film formation method or the film forming condition. For example, a vacuum deposition method and a sputtering process have different angular dependencies for directions in which particles travel, so that the width of the side high refractive index sections 14a may be changed in accordance with the method used. In addition, after the formation of the high refractive index layer 18, the width of the side high refractive index sections 14a may be narrowed down by etching.

Figure 6:
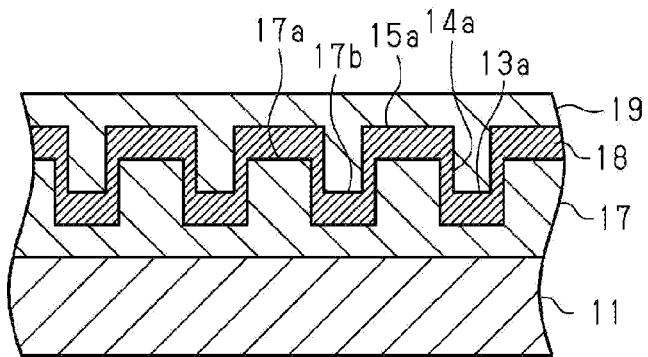
FIG. 6 illustrates a step of forming a filling layer in the method of manufacturing the wavelength selection filter according to the first embodiment.

Next, as shown in FIG. 6, the filling layer 19 made of a low refractive index material is formed over the surface of the structure of the projection-depression structure layer 17 and the high refractive index layer 18, and the surface projections and depressions of the high refractive index layer 18 are filled up to the second high refractive index sections 15a.

The filling layer 19 may be formed by a known film formation technique such as a variety of application processes. For example, if the low refractive index material is an ultraviolet-curing resin, the ultraviolet-curing resin is first applied to the surface of the high refractive index layer 18. Then, a flat plate formed of a material that transmits ultraviolet radiation is pressed against the surface of the applied layer of the ultraviolet-curing resin, and the applied layer is irradiated with ultraviolet radiation. Subsequently, the UV-cured resin is released from the flat plate.

As described above, the wavelength selection filter 10 allows the emergence of light in the wavelength range intensified in the first grating region 13 and light in the wavelength range intensified in the second grating region 15, so that the resultant reflected light has higher intensity. This enables the wavelength selection filter 10 having higher wavelength selectivity to be manufactured without precisely controlling the film thickness of the layer in contact with the first grating region 13 or the second grating region 15, or more specifically, without precisely controlling the film thickness of the remaining film when the wavelength selection filter 10 is formed by nanoimprinting. Thus, the wavelength selection filter 10 is manufactured easily.

Furthermore, the wavelength selection filter 10 can be formed by a manufacturing method combining a photo-nanoimprinting method and a vacuum deposition method or the like, and is therefore suitable for manufacturing the wavelength selection filter 10 by a roll-to-roll method. Thus, the structure of the wavelength selection filter 10 is also appropriate for mass production.

In the manufacturing method described above, the projection-depression structure layer 17 may be formed by nanoimprinting using a thermosetting resin or a thermoplastic resin in place of the ultraviolet-curing resin. For a thermosetting resin, the irradiation with ultraviolet radiation may be changed to heating. For a thermoplastic resin, the irradiation with ultraviolet radiation may be changed to heating and cooling.

However, if the projection-depression structure layer 17 is formed using a thermoplastic resin, it is preferable to form the filling layer 19 from a material different from a thermoplastic resin to prevent the projection-depression structure layer 17 from being deformed by heating during the formation of the filling layer 19. For example, the projection-depression structure layer 17 may be formed from a thermoplastic resin, whereas the filling layer 19 may be formed from an ultraviolet-curing resin.

Figure 7:
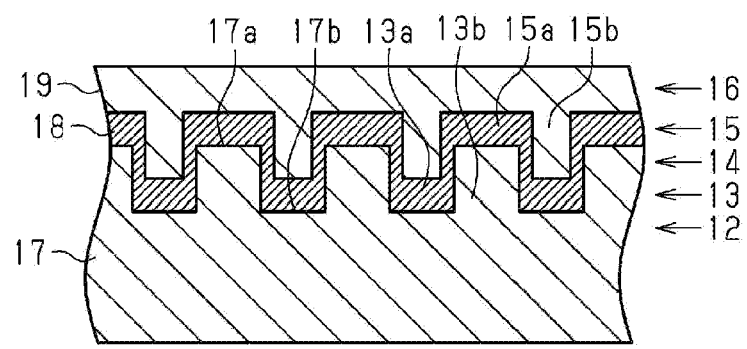
FIG. 7 illustrates a cross-sectional structure of a wavelength selection filter according to a modification of the first embodiment.

Furthermore, as shown in FIG. 7, the wavelength selection filter 10 may not necessarily include the substrate 11. In this case, the projection-depression structure layer 17 is made by forming the projection-depression structure in the surface of a substrate made from a low refractive index material. For example, with a sheet of thermoplastic resin, the projection-depression structure may be formed in the surface of the sheet. Alternatively, with a substrate of synthetic quartz, the projection-depression structure may be formed in the surface of the substrate. For a synthetic quartz substrate, the projection-depression structure may be formed using a known technique such as dry etching.

[Application Examples of Wavelength Selection Filter]

Specific application examples of the above wavelength selection filter 10 will be described.

<Wavelength Selection Device>

Figure 8:
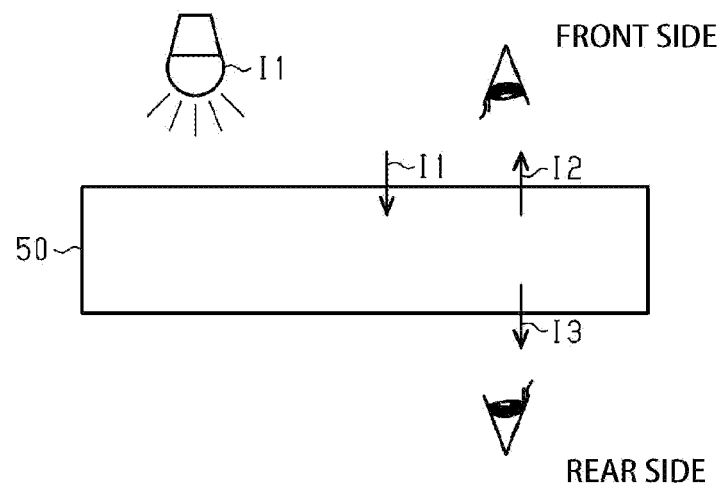
FIG. 8 illustrates an effect of a wavelength selection device which is an application example of the wavelength selection filter according to the first embodiment.

A first application example of the wavelength selection filter 10 is the use of the wavelength selection filter 10 in a wavelength selection device 50. As shown in FIG. 8, when receiving incident light I1 including light in a plurality of wavelengths, the wavelength selection device 50 reflects light I2 in a specific wavelength range, and transmits light I3 in the wavelength range other than the light in the specific wavelength range. The wavelength selection device 50 has the configuration of the wavelength selection filter 10. For example, the wavelength selection device 50 is arranged so that light is incident from the front side of the wavelength selection filter 10. The wavelength ranges of the light I2 and the light I3 may be adjusted in accordance with the settings of the periods and the thicknesses of the subwavelength gratings included in the first grating region 13 and the second grating region 15.

The wavelength selection device 50 may be used in a mode of using the light I2, which is reflected light, a mode of using the light I3, which is transmitted light, or a mode of using both the light I2 and the light I3. For example, the wavelength selection device 50 may be used as a device that involves color separation or a member included in lighting.

As described above, the wavelength selection filter 10 according to the first embodiment increases the wavelength selectivity, so that the use of this configuration of the wavelength selection filter 10 can provide the wavelength selection device 50 with improved wavelength selectivity.

<Display>

A second application example of the wavelength selection filter 10 is the use of the wavelength selection filter 10 in a display. The display may be used for the purpose of increasing the difficulty in counterfeiting an article, may be used for the purpose of enhancing the designability of an article, or may be used for both purposes. For the purpose of increasing the difficulty in counterfeiting an article, the display may be affixed, for example, to identification documents such as passports or licenses, securities such as gift certificates or checks, cards such as credit cards or cash cards, or bills. For the purpose of enhancing the designability of an article, the display may be affixed, for example, to wearable ornaments, articles carried by users, stationary articles such as furniture or home appliances, or structures such as walls and doors.

Figure 9:
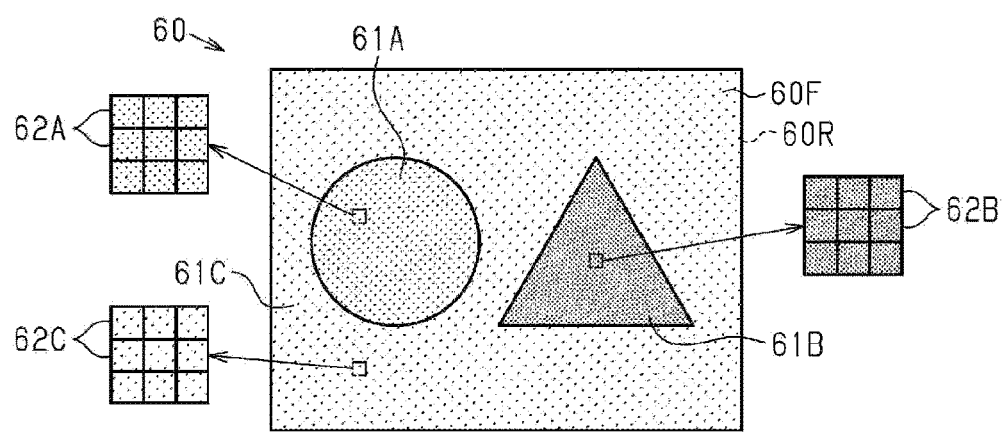
FIG. 9 illustrates a planar structure of a display which is an application example of the wavelength selection filter according to the first embodiment.

As shown in FIG. 9, a display 60 has a front surface 60F, and a rear surface 60R on a surface opposite to the front surface 60F. As viewed in a direction facing the front of the front surface 60F, the display 60 includes a first display region 61A, a second display region 61B, and a third display region 61C. The first display region 61A is a region in which a plurality of first pixels 62A are arranged. The second display region 61B is a region in which a plurality of second pixels 62B are arranged. The third display region 61C is a region in which a plurality of third pixels 62C are arranged. In other words, the first display region 61A is formed of the set of the first pixels 62A, the second display region 61B is formed of the set of the second pixels 62B, and the third display region 61C is formed of the set of the third pixels 62C.

The first display region 61A, the second display region 61B, and the third display region 61C, alone or in combination of two or more regions, may represent a character, a sign, a figure, a pattern, or a design, and the background thereof. In an example shown in FIG. 9, the first display region 61A represents a circle, the second display region 61B represents a triangle, and the third display region 61C represents the background.

Each of the first pixels 62A, the second pixels 62B, and the third pixels 62C has the configuration of the wavelength selection filter 10. The first pixels 62A, the second pixels 62B, and the third pixels 62C are each arranged with the second direction and the third direction along the front surface 60F of the display 60. For example, the pixels 62A, 62B, and 62C are oriented so that the front side of the wavelength selection filter 10 corresponds to the front side of the display 60.

The first pixels 62A, the second pixels 62B, and the third pixels 62C have different wavelength ranges that allow resonance that is guided-mode resonance. The wavelength ranges that allow resonance in the pixels 62A, 62B, and 62C are set at desired wavelength ranges by, for example, adjusting the periods of the subwavelength gratings included in the first grating region 13 and the second grating region 15 for each of the pixels 62A, 62B, and 62C. Thus, when receiving incident light including light in a plurality of wavelengths, the reflected light emerging from the first pixels 62A, the reflected light emerging from the second pixels 62B, and the light reflected from the third pixels 62C have different wavelength ranges to each other. Meanwhile, when receiving the incident light, the transmitted light emerging from the first pixels 62A, the transmitted light emerging from the second pixels 62B, and the transmitted light emerging from the third pixels 62C have different wavelength ranges.

Figure 10:
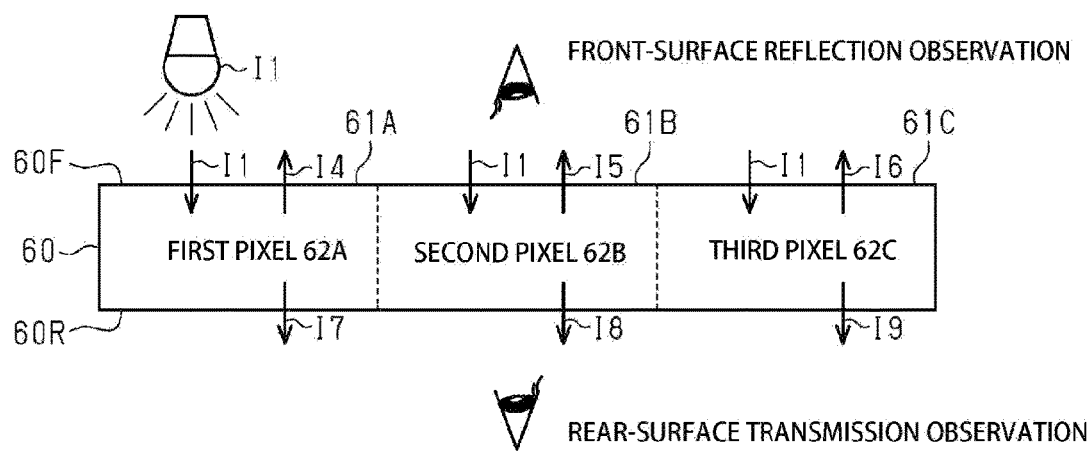
FIG. 10 illustrates an effect of the display which is an application example of the wavelength selection filter according to the first embodiment.

More specifically, as shown in FIG. 10, when the incident light I1 is applied to the front surface 60F of the display 60 from outside the display 60, reflected light I4 emerges from the first pixels 62A, reflected light I5 emerges from the second pixels 62B, and reflected light I6 emerges from the third pixels 62C at the front side of the display 60. Thus, when the front surface 60F of the display 60 is viewed from the front, the hue depending on the wavelength range of the reflected light I4 is visible in the first display region 61A, the hue depending on the wavelength range of the reflected light I5 is visible in the second display region 61B, and the hue depending on the wavelength range of the reflected light I6 is visible in the third display region 61C. Since the wavelength range of the reflected light I4, the wavelength range of the reflected light I5, and the wavelength range of the reflected light I6 are different from each other, the first display region 61A, the second display region 61B, and the third display region 61C provide different hues.

As a result, when a front-surface reflection observation is performed on the front surface 60F from the front of the display 60 with the incident light I1 being applied to the front surface 60F from outside the display 60, an image is visible formed by the first display region 61A, the second display region 61B, and the third display region 61C that have colors different from each other.

When the incident light I1 is applied to the front surface 60F of the display 60 from outside the display 60, transmitted light I7 emerges from the first pixels 62A, transmitted light I8 emerges from the second pixels 62B, and transmitted light I9 emerges from the third pixels 62C at the rear side of the display 60. Thus, when the rear surface 60R of the display 60 is viewed from the rear of the display, the hue depending on the wavelength range of the transmitted light I7 is visible in the first display region 61A, the hue depending on the wavelength range of the transmitted light I8 is visible in the second display region 61B, and the hue depending on the wavelength range of the transmitted light I9 is visible in the third display region 61C. Since the wavelength range of the transmitted light 17, the wavelength range of the transmitted light 18, and the wavelength range of the transmitted light 19 are different from each other, the first display region 61A, the second display region 61B, and the third display region 61C provide different hues.

As a result, also when a rear-surface transmission observation is performed on the rear surface 60R from the rear of the display 60 with the incident light I1 being applied to the front surface 60F from outside the display 60, an image is visible formed by the first display region 61A, the second display region 61B, and the third display region 61C that have colors different from each other.

In addition, since the wavelength range of the reflected light I4 is different from the wavelength range of the transmitted light 17, the hue visible in the first display region 61A differs between when the display 60 is viewed from the front and when the display 60 is viewed from the rear. The color visible from the rear corresponds to the complementary color of the color visible from the front. Similarly, the hue visible in the second display region 61B and also the hue visible in the third display region 61C differ between when the display 60 is viewed from the front and when the display 60 is viewed from the rear.

Thus, the front-surface reflection observation and the rear-surface transmission observation result in visual recognition of differently colored images on the display 60. Therefore, in an article provided with the display 60, the difficulty of counterfeit, and designability are further enhanced. The front and the rear of the display 60 can also be distinguished easily.

As described above, the wavelength selection filter 10 according to the first embodiment increases the wavelength selectivity, so that the use of this configuration of the wavelength selection filter 10 in each of the pixels 62A, 62B, and 62C improves the clarity and the brightness of the colors visible in the display regions 61A, 61B, and 61C. Accordingly, the display 60 forms an image with higher visibility. Furthermore, the wavelength selection filter 10 according to the first embodiment may include a flexible substrate 11 such as a resin film, thus enabling the display 60 to have a high degree of flexibility in modification of shape.

The first pixels 62A, the second pixels 62B, and the third pixels 62C have the substrate 11, the first low refractive index region 12, the first grating region 13, the intermediate region 14, the second grating region 15, and the second low refractive index region 16 that are continuous therethrough. That is, the first pixels 62A, the second pixels 62B, and the third pixels 62C share the single substrate 11 and have projection-depression structure layers 17 continuous with each other between the pixels, high refractive index layers 18 continuous with each other between the pixels, and filling layers 19 continuous with each other between the pixels.

The projection-depression structure layer 17 in each of the first pixels 62A, the second pixels 62B, and the third pixels 62C may be formed at the same time by, for example, nanoimprinting using a synthetic quartz mold having different projection-depression periods in the portions corresponding to the pixels 62A, 62B, and 62C. Also for the high refractive index layer 18 and the filling layer 19, the portions corresponding to the pixels 62A, 62B, and 62C may also be formed at the same. Thus, the pixels 62A, 62B, and 62C that show different colors from each other can be formed easily.

The number of display regions included in the display 60, or the number of display regions including pixels with the configuration of the wavelength selection filter 10 and showing hues different from each other, is not limited to a particular number. The number of display regions may be one, or four or more. The display 60 may also include a region with a configuration different from the configuration of the wavelength selection filter 10, for example, a region with a structure in which only flat layers made from a low refractive index material are laminated on the substrate 11.

Furthermore, the display region may include a display element with the configuration of the wavelength selection filter 10. The display element may be not only a pixel, which is the minimum repeating unit for forming a raster image, but also an area formed by connecting anchor points for forming a vector image.

<Color Filter>

A third application example of the wavelength selection filter 10 is the use of the wavelength selection filter 10 in a color filter.

Figure 11:
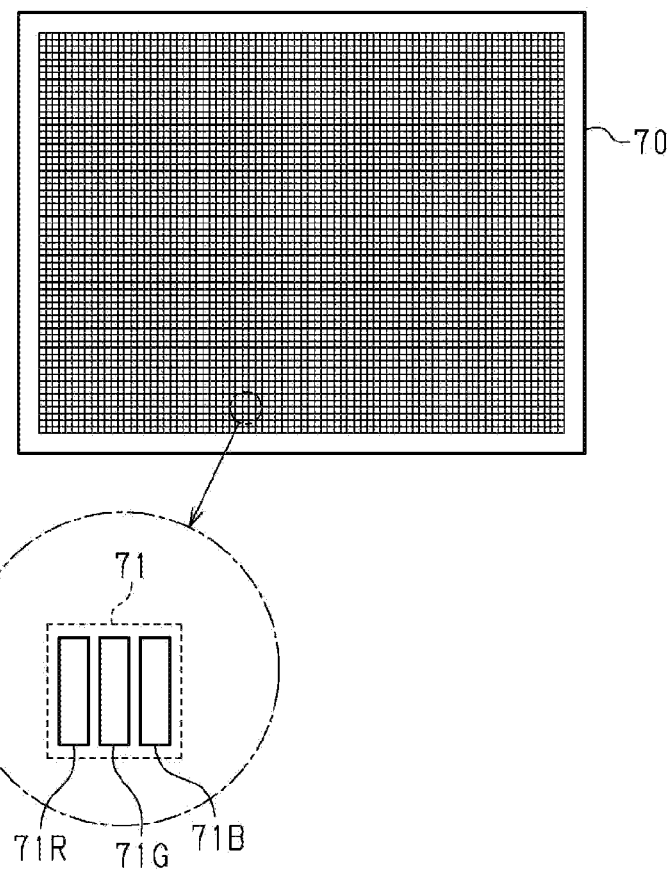
FIG. 11 illustrates a planar structure of a color filter which is an application example of the wavelength selection filter according to the first embodiment.

As shown in FIG. 11, a color filter 70 has a plurality of pixels 71 arranged in the form of a matrix. Each pixel 71 includes three subpixels: a red subpixel 71R, a green subpixel 71G, and a blue subpixel 71B.

The color filter 70 is a reflective color filter and is included in a display device. Relative to the color filter 70, the position of an observer viewing the display surface of the display device is the front of the color filter 70. Relative to the color filter 70, the side opposite to the front is the rear of the color filter 70. The color filter 70 is irradiated with light from the front. The intensity of light applied to the color filter 70 is adjustable for each subpixel by, for example, a liquid crystal device.

The red subpixel 71R converts light incident on the red subpixel 71R into red light and reflects the resultant red light. The green subpixel 71G converts light incident on the green subpixel 71G into green light and reflects the resultant green light. The blue subpixel 71B converts light incident on the blue subpixel 71B into blue light and reflects the resultant blue light.

Each of the red subpixel 71R, the green subpixel 71G, and the blue subpixel 71B has the configuration of the wavelength selection filter 10. The red subpixel 71R, the green subpixel 71G, and the blue subpixel 71B are each arranged with the second direction and the third direction along the front surface of the color filter 70. For example, the subpixels 71R, 71G, and 71B are oriented so that the front side of the wavelength selection filter 10 corresponds to the front side of the color filter 70.

Figure 12:
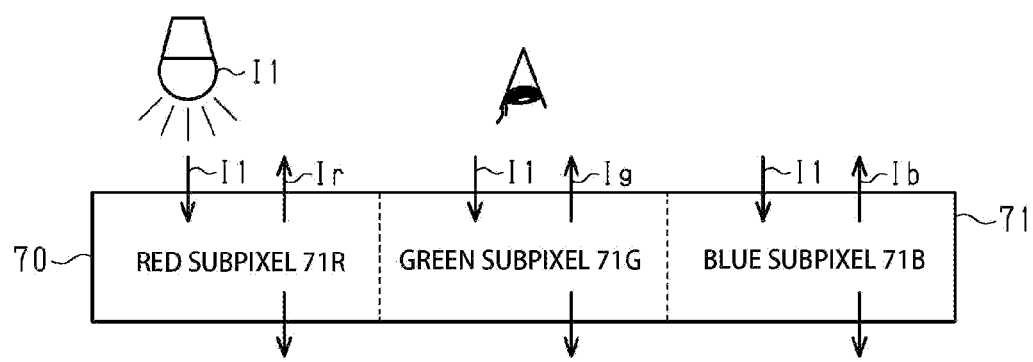
FIG. 12 illustrates an effect of the color filter which is an application example of the wavelength selection filter according to the first embodiment.

As shown in FIG. 12, the red subpixel 71R has a subwavelength grating period that may be set so that red reflected light Ir emerges to the front when receiving the incident light I1 including light in a plurality of wavelengths from the front of the color filter 70. The green subpixel 71G has a subwavelength grating period that may be set so that green reflected light Ig emerges to the front in response to the reception of the incident light I1. The blue subpixel 71B has a subwavelength grating period that may be set so that blue reflected light Ib emerges to the front in response to the reception of the incident light I1. The intensity of incident light for each of the subpixels 71R, 71G, and 71B is adjusted to change the color visible as the pixel 71, and the set of pixels 71 forms an image displayed on the display device.

As described above, the wavelength selection filter 10 according to the first embodiment increases the wavelength selectivity, so that the use of the configuration of the wavelength selection filter 10 in each of the subpixels 71R, 71G, and 71B improves the clarity and the luminance of the colors in the subpixels 71R, 71G, and 71B.

Additionally, as in the display 60 described above, the red subpixel 71R, the green subpixel 71G, and the blue subpixel 71B have the substrate 11, the first low refractive index region 12, the first grating region 13, the intermediate region 14, the second grating region 15, and the second low refractive index region 16 that are continuous therethrough. That is, the red subpixel 71R, the green subpixel 71G, and the blue subpixel 71B share the single substrate 11 and have projection-depression structure layers 17 continuous with each other between the subpixels, high refractive index layers 18 continuous with each other between the subpixels, and filling layers 19 continuous with each other between the subpixels.

The projection-depression structure layer 17 in each of the red subpixel 71R, the green subpixel 71G, and the blue subpixel 71B may be formed at the same by, for example, nanoimprinting using a synthetic quartz mold having different projection-depression periods in the portions corresponding to the subpixels 71R, 71G, and 71B. Also for the high refractive index layer 18 and the filling layer 19, the portions corresponding to the subpixels 71R, 71G, and 71B may also be formed at the same. Thus, the color filter 70 having the three-color subpixels 71R, 71G, and 71B can be formed easily.

According to the first embodiment, the advantageous effects enumerated below are achieved.

(1) The ratio of the optical film thickness OT2 of the second grating region 15 to the optical film thickness OT1 of the first grating region 13 is 0.7 or more and 1.3 or less, so that light in close wavelength ranges intensified in the two grating regions 13 and 15 is produced as reflected light. Accordingly, compared with a wavelength selection filter having only one grating region, light extracted as reflected light has a high intensity, resulting in an increase in the wavelength selectivity.

(2) For the area ratio R3 of the side high refractive index sections 14a in the intermediate region 14, the satisfaction of R3≤R1+R2−1 keeps the width of the side high refractive index sections 14a narrow, thus regulating the average refractive index of the intermediate region 14 from becoming excessively large. Accordingly, the grating regions 13 and 15 each have an appropriate difference in average refractive index from their adjacent regions, so that reflected light produced by guided-mode resonance from each of the grating regions 13 and 15 has good intensity.

Additionally, as viewed in a direction along the first direction, the second high refractive index sections 15a extend beyond the side high refractive index sections 14a, and accordingly the width of the side high refractive index sections 14a are kept narrow. Thus, reflected light from each of the grating regions 13 and 15 has good intensity in the same manner as described above.

(3) With the thickness T1 of the first grating region 13 equal to the thickness T2 of the second grating region 15, and the refractive index n2 of the material for the projection-depression structure layer 17 equal to the refractive index n3 of the material for the filling layer 19, when the area ratio R1 of the first high refractive index section 13a is equal to the area ratio R2 of the second high refractive index sections 15a, the optical film thickness OT1 matches the optical film thickness OT2, thus allowing the wavelength selectivity to be significantly high.

(4) The wavelength selection filter 10 is formed by the step of forming the projection-depression structure layer 17 made of a low refractive index material, the step of forming the high refractive index layer 18 on the surface of the projection-depression structure layer 17, and the step of forming the filling layer 19 made of a low refractive index material on the surface of the high refractive index layer 18. This enables the wavelength selection filter 10 to be manufactured easily because the wavelength selectivity of the wavelength selection filter 10 can be increased without precisely controlling the film thickness of the layer in contact with the subwavelength grating.

In particular, in a production method of forming the projection-depression structure layer 17 with a resin used as a low refractive index material by pressing an intaglio plate against the applied layer made of the resin and then curing the resin, the projection-depression structure layer 17 is formed by nanoimprinting. This enables the projection-depression structure layer 17 having fine projections and depressions to be formed easily and appropriately.

(5) In a vacuum deposition method for forming the high refractive index layer 18, the high refractive index layer 18 is formed so that the second high refractive index sections 15a extend beyond the side high refractive index sections 14a as viewed in a direction along the first direction. This production method allows the side high refractive index sections 14a to be narrow in spite of the adoption of the process in which the side high refractive index sections 14a are formed on the side surfaces of the projections 17a, thus improving the intensity of reflected light from each of the grating regions 13 and 15.

Second Embodiment

A second embodiment will be described with reference to FIGS. 13 to 16. The second embodiment is an embodiment of a wavelength selection filter and a method of manufacturing the wavelength selection filter. In the following description, differences between the second embodiment and the first embodiment will be mainly described, and the same components as in the first embodiment are given the same reference numerals and will not be described.

[Configuration of Wavelength Selection Filter]

Figure 13:
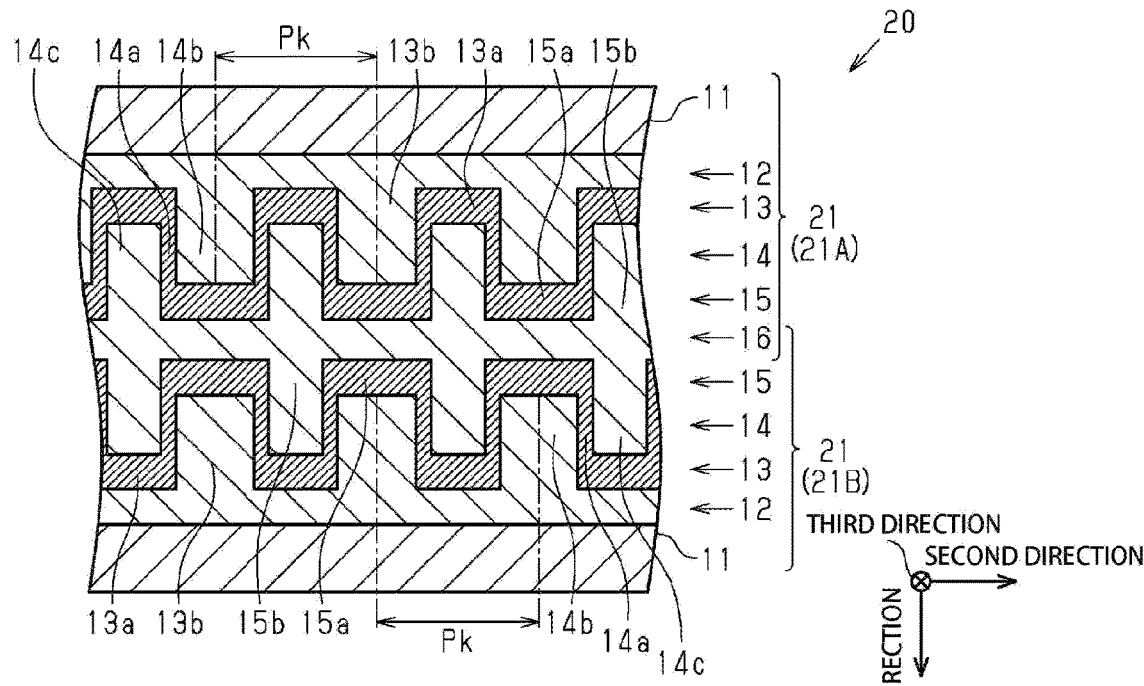
FIG. 13 illustrates an example of the cross-sectional structure of a wavelength selection filter according to a second embodiment.
Figure 14:
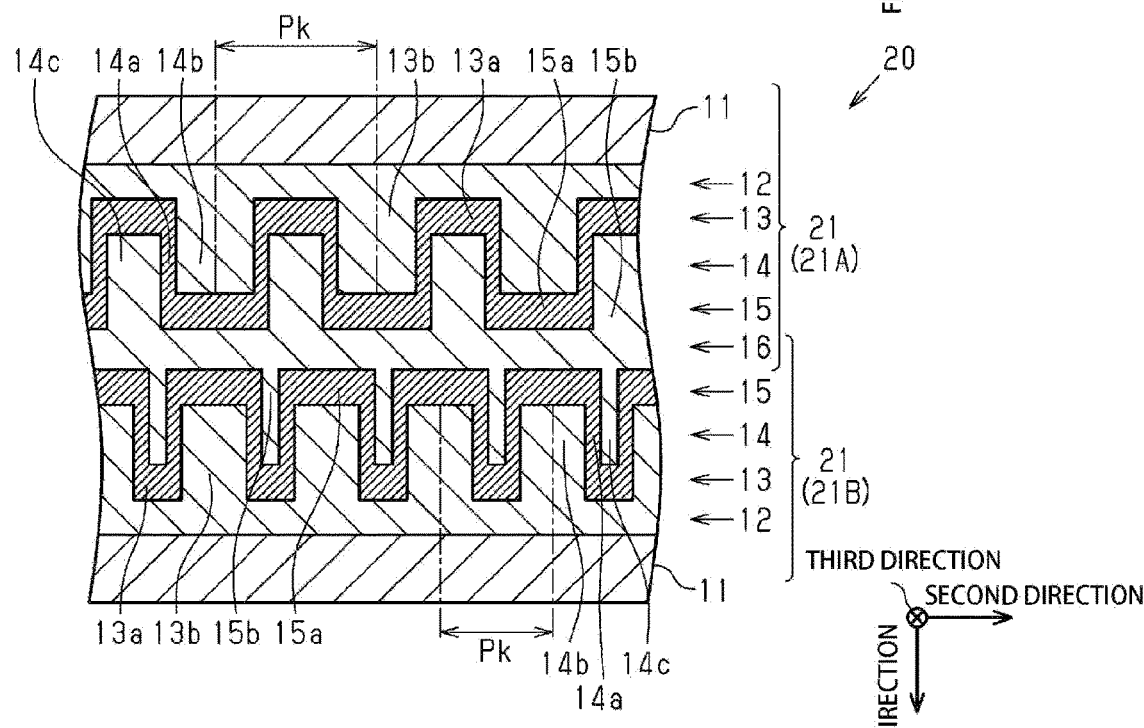
FIG. 14 illustrates an example of the cross-sectional structure of the wavelength selection filter according to the second embodiment.

The configuration of a wavelength selection filter according to the second embodiment will be described with reference to FIGS. 13 and 14. As shown in FIG. 13, a wavelength selection filter 20 according to the second embodiment includes two resonant structures 21, each of which is a structure including a first low refractive index region 12, a first grating region 13, an intermediate region 14, a second grating region 15, and a second low refractive index region 16 described in the first embodiment.

The two resonant structure 21, or a first resonant structure 21A and a second resonant structure 21B, are adjacent to each other in the first direction. The two resonant structures 21A and 21B are sandwiched between two substrates 11. In other words, the wavelength selection filter 20 according to the second embodiment has a structure in which two wavelength selection filters 10 according to the first embodiment are joined together with the second low refractive index regions 16 facing each other. That is, the wavelength selection filter 20 according to the second embodiment includes four subwavelength gratings spaced apart from each other in the first direction, and has a structure in which these subwavelength gratings are embedded in a low refractive index material. The side of a first substrate 11 relative to a second substrate 11 is the front of the wavelength selection filter 20, and the side of the second substrate 11 relative to the first substrate 11 is the rear of the wavelength selection filter 20.

The first resonant structure 21A and the second resonant structure 21B may share a low refractive index region along the boundary between the structures. In an example illustrated in FIG. 13, the second low refractive index region 16 included in the first resonant structure 21A and the second low refractive index region 16 included in the second resonant structure 21B are continuous and have no boundary between the regions.

The projections 17a in the first resonant structure 21A have an arrangement period referred to as a structure period Pk, and the projections 17a in the second resonant structure 21B also have an arrangement period referred to as a structure period Pk. The structure periods Pk may be the same as shown in FIG. 13 or different from each other as shown in FIG. 14. The structure periods Pk matches the first period P1 in the first grating region 13.

In each of the first resonant structure 21A and the second resonant structure 21B, the ratio of the optical film thickness OT2 of the second grating region 15 to the optical film thickness OT1 of the first grating region 13 is 0.7 or more and 1.3 or less. With the two resonant structures 21A and 21B having the same structure period Pk, the above ratios in the first resonant structure 21A and the second resonant structure 21B will preferably be the same.

In the two resonant structures 21A and 21B, the directions in which the elements forming the subwavelength gratings are arranged, or the directions in which the two-dimensional lattices extend, may be the same or different from each other. The two resonant structures 21A and 21B that have two-dimensional lattices extending in different directions enable reflected light to emerge for more directions of polarization.

[Effect of Wavelength Selection Filter]

With the two resonant structures 21A and 21B having the same structure period Pk, the four grating regions 13 and 15 included in the wavelength selection filter 20 allow light to produce resonance in wavelength ranges close to each other. Reflected light within the wavelength ranges intensified in the four grating regions 13 and 15 emerges to the front of the wavelength selection filter 20, so that the reflected light from the wavelength selection filter 20 has an increased intensity in a particular wavelength range compared with the wavelength selection filter 10 according to the first embodiment, resulting in higher wavelength selectivity for reflected light. In this structure, as described above, it is preferable that the first resonant structure 21A and the second resonant structure 21B have the same ratio of the optical film thickness OT2 to the optical film thickness OT1 because the four grating regions 13 and 15 will vary less in optical film thickness, and the grating regions 13 and 15 will have closer wavelength ranges of light that produces resonance.

In contrast, with the two resonant structures 21A and 21B having different structure periods Pk, the wavelength range of light that produces resonance in the grating regions 13 and 15 in the first resonant structure 21A is different from the wavelength range of light that produces resonance in the grating regions 13 and 15 in the second resonant structure 21B. As a result, reflected light including the light in the wavelength range intensified in the grating regions 13 and 15 of the first resonant structure 21A and the light in the wavelength range intensified in the grating regions 13 and 15 of the second resonant structure 21B emerges to the front of the wavelength selection filter 20.

At the rear of the wavelength selection filter 20, the light in the wavelength range of the light incident on the wavelength selection filter 20, except the wavelength range of the emerging reflected light, emerges as transmitted light. This configuration enables the wavelength selection filter 20 to provide a wider wavelength range of reflected light while intensifying the reflected light, and a narrower wavelength range of transmitted light than in a structure having a single grating region. This increases the flexibility to adjust hues observed as reflected light and transmitted light.

[Application Examples of Wavelength Selection Filter]

The configuration of the wavelength selection filter 20 according to the second embodiment may be used in the wavelength selection device 50, the display elements included in the display 60, or the subpixels included in the color filter 70 in the same manner as the application examples illustrated in the first embodiment.

In an example with the two resonant structures 21A and 21B having the same structure period Pk, the use of this configuration enables the wavelength selection device 50 to have higher wavelength selectivity for reflected light. For the display 60, the use of this configuration improves the clarity and the brightness of the colors visible in the display regions 61A, 61B, and 61C in a front-surface reflection observation, thus increasing the visibility of an image. For the color filter 70, the use of the configuration improves the clarity and the luminance of the colors in the subpixels 71R, 71G, and 71B, providing the reflective color filter 70 including the subpixels 71R, 71B, and 71G from which highly monochromatic reflected light emerges.

In an example with the two resonant structures 21A and 21B having different structure periods Pk, the use of this configuration increases the flexibility of the wavelength selection device 50 to adjust hues observed as reflected light and transmitted light. For the display 60, the use of this configuration increases the flexibility to adjust hues of images observed in front-surface reflection observation and rear-surface transmission observation. For the color filter 70, the use of the configuration provides a transmissive color filter, or specifically, a color filter that is irradiated with light on the rear surface of the color filter and allows the observer to see transmitted light passing through the color filter from the front surface of the color filter.

More specifically, the green subpixel 71G is configured to allow the light in the red wavelength range to be intensified in the first resonant structure 21A and emerge as reflected light to the rear, and also allow the light in the blue wavelength range to be intensified in the second resonant structure 21B and emerge as reflected light to the rear. With this configuration, when the rear surface of the color filter 70 receives white incident light, green transmitted light emerges from the front surface of the color filter 70. As the color filter 70 is viewed from the front, green is visible at the green subpixel 71G. Similarly, the red subpixel 71R is configured to allow the emergence of transmitted light in the red wavelength range, whereas the blue subpixel 71B is configured to allow the emergence of transmitted light in the blue wavelength range. This provides the transmissive color filter 70 including the subpixels 71R, 71B, and 71G from which highly monochromatic transmitted light emerges.

[Method of Manufacturing Wavelength Selection Filter]

A method of manufacturing the wavelength selection filter 20 according to the second embodiment will now be described with reference to FIGS. 15 and 16. In the manufacturing of the wavelength selection filter 20 according to the second embodiment, a projection-depression structure layer 17 and then a high refractive index layer 18 are first formed on a substrate 11 as in the first embodiment.

Figure 15:
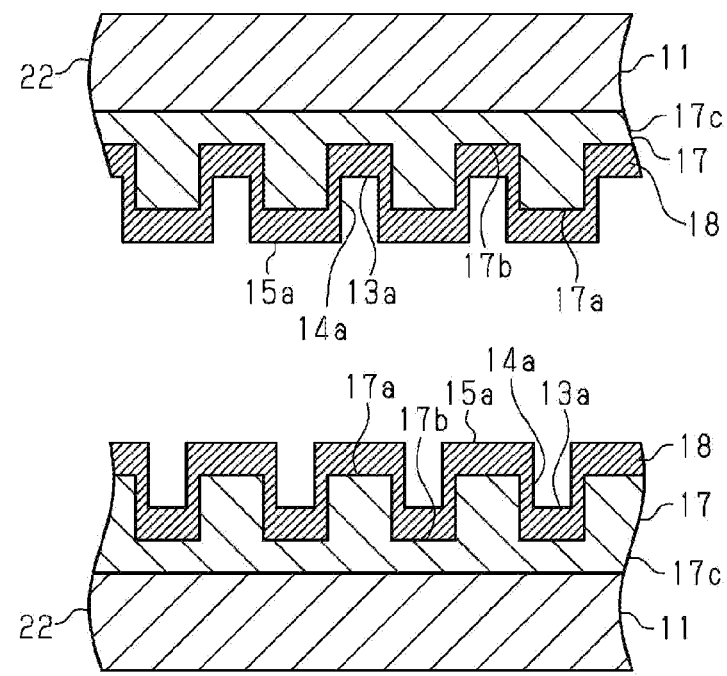
FIG. 15 illustrates projection-depression structures facing each other in a method of manufacturing the wavelength selection filter according to the second embodiment.

Then, as shown in FIG. 15, two projection-depression structures 22, each of which is a structure having the substrate 11, the projection-depression structure layer 17, and the high refractive index layer 18, are placed facing each other so that the high refractive index layers 18 face each other. As shown in FIG. 16, the projection-depression structures 22 are joined to each other by filling the space between the two projection-depression structures 22 with a low refractive index material. The wavelength selection filter 20 is thus formed.

Figure 16:
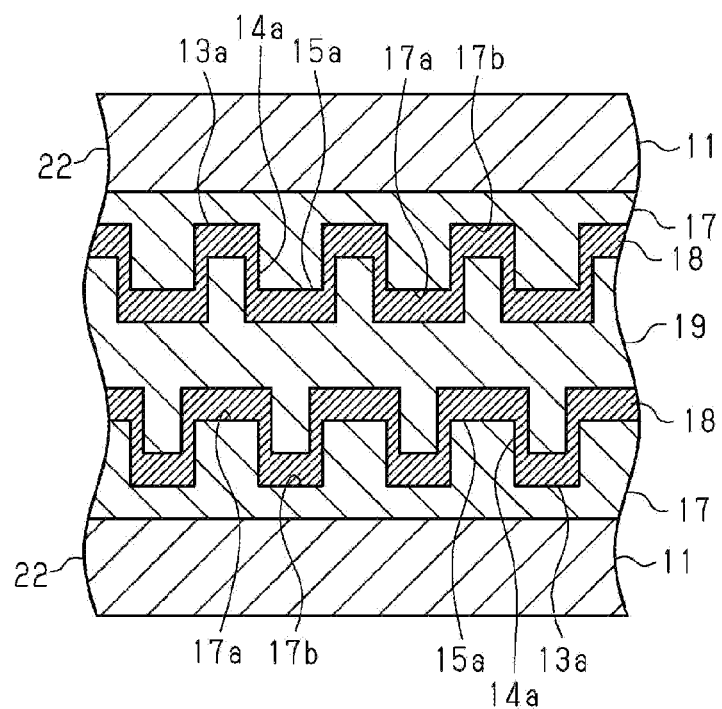
FIG. 16 illustrates a step of forming a filling layer in the method of manufacturing the wavelength selection filter according to the second embodiment.

As shown in FIG. 16, the section formed between the two projection-depression structures 22 by the filling with the low refractive index material is a filling layer 19. As in the first embodiment, the low refractive index material for the filling layer 19 may be different from the material for the projection-depression structure layer 17 so long as the low refractive index material is a material lower in refractive index than the high refractive index material for the high refractive index layer 18. Furthermore, in the two projection-depression structures 22, the projection-depression structure layers 17 may be formed from different low refractive index materials, and the high refractive index layers 18 may also be formed from different high refractive index materials.

With the two projection-depression structures 22 facing each other, the second high refractive index sections 15a may face each other, or the first high refractive index section 13a in one projection-depression structure 22 may face the second high refractive index sections 15a in the other projection-depression structure 22. Alternatively, the first high refractive index section 13a in one projection-depression structure 22 may face a part of the first high refractive index section 13a in the other concave-convex structure 22 and may face a part of the second high refractive index sections 15a in the other projection-depression structure 22.

In an example with the two projection-depression structures 22 including the projections 17a that have the same period, joining the projection-depression structures 22 will form the wavelength selection filter 20 including the two resonant structures 21A and 21B that have the same structure period Pk. In an example with the two projection-depression structures 22 including the projections 17a that have different periods, joining the projection-depression structures 22 will form a wavelength selection filter 20 including two resonant structures 21A and 21B that have different structure periods Pk.

The wavelength selection filter 20 may also include three or more resonant structures 21 arranged in the first direction. For the wavelength selection filter 20 that includes a plurality of resonant structures 21, if the resonant structures 21 have the same structure period Pk, the intensity of reflected light becomes higher as the number of resonant structures 21 increases. The plurality of resonant structures 21 may include resonant structures 21 having the same structure period Pk and resonant structures 21 having structure periods Pk different from each other. This configuration enables fine color-adjustments for reflected light or transmitted light emerging from the wavelength selection filter 20.

In manufacturing of the wavelength selection filter 20 having three or more resonant structures 21, the substrate 11 and the projection-depression structure layer 17 in each projection-depression structure 22 are formed from a material that allows the substrate 11 to be peeled from the projection-depression structure layer 17. Then, after two projection-depression structures 22 are joined to each other via a low refractive index material, one substrate 11 is peeled, and the exposed projection-depression structure layer 17 is joined to another projection-depression structure 22 via a low refractive index material. This process is repeated to form the wavelength selection filter 20 having six or more subwavelength gratings.

As described above, according to the second embodiment, the following effects are achieved in addition to effects (1) to (5) in the first embodiment.

(6) The wavelength selection filter 20 includes the plurality of resonant structures 21 arranged in the first direction, and accordingly the wavelength selection filter 20 has the four or more grating regions 13 and 15. This enables a further improvement in the wavelength selectivity of the wavelength selection filter 20 and an increase in the flexibility to adjust wavelength ranges included in reflected light and transmitted light.

(7) With the plurality of resonant structures 21 having the same structure period Pk, the grating regions 13 and 15 of each of the resonant structures 21 have nearer wavelength ranges of light that produces resonance. Thus, light in near wavelength ranges intensified in the grating regions 13 and 15 of each resonant structure 21 emerge as reflected light, so that reflected light in a specific wavelength range has a higher intensity, resulting in an increase in the wavelength selectivity for reflected light.

(8) With the first resonant structure 21A and the second resonant structure 21B having the same ratio of the optical film thickness OT2 to the optical film thickness OT1, the four grating regions 13 and 15 will vary less in optical film thickness, and thus the grating regions 13 and 15 allow light to produce resonance in nearer wavelength ranges. Accordingly, the wavelength selectivity for reflected light increases further.

(9) With the structure period Pk of the first resonant structure 21A and the structure period Pk of the second resonant structure 21B being different from each other, the wavelength range of light that produces resonance in the grating regions 13 and 15 in the first resonant structure 21A is different from the wavelength range of light that produces resonance in the grating regions 13 and 15 in the second resonant structure 21B. Accordingly, the wavelength selection filter 20 can provide a wider wavelength range of reflected light while intensifying the reflected light, and a narrower wavelength range of transmitted light than in a structure having a single grating region. This increases the flexibility to adjust hues observed as reflected light and transmitted light.

(10) The wavelength selection filter 20 is formed by placing the two projection-depression structures 22 with their high refractive index layers 18 facing each other, and then filling the space between the two projection-depression structures 22 with a low refractive index material. This enables easy formation of the wavelength selection filter 20 including the plurality of resonant structures 21.

[Modifications of First and Second Embodiments]

The above embodiments may be modified and implemented as described below.

Each of the grating regions 13 and 15 may have different grating structure periods depending on the directions in which the two-dimensional lattice extends. This configuration enables adjustments in the wavelength range of reflected light and the responsivity to polarization by using resonance wavelength ranges different for different directions in which the two-dimensional lattice extends.

In the above embodiments, the projection-depression structure of the projection-depression structure layer 17 includes the plurality of projections 17a spaced from each other and the single depression 17b continuous among the projections 17a. Instead, the projection-depression structure of the projection-depression structure layer 17 may include a plurality of depressions spaced from each other and a single projection continuous among the depressions. That is, the projection-depression structure of the projection-depression structure layer 17 may have any structure with a plurality of projection-depression elements that are projections or depressions spaced from each other and arranged in the form of a two-dimensional lattice.

Third Embodiment

A third embodiment will be described with reference to FIGS. 17 and 18. The third embodiment is an embodiment of a display device.
[Configuration of Display Device]

Figure 17:
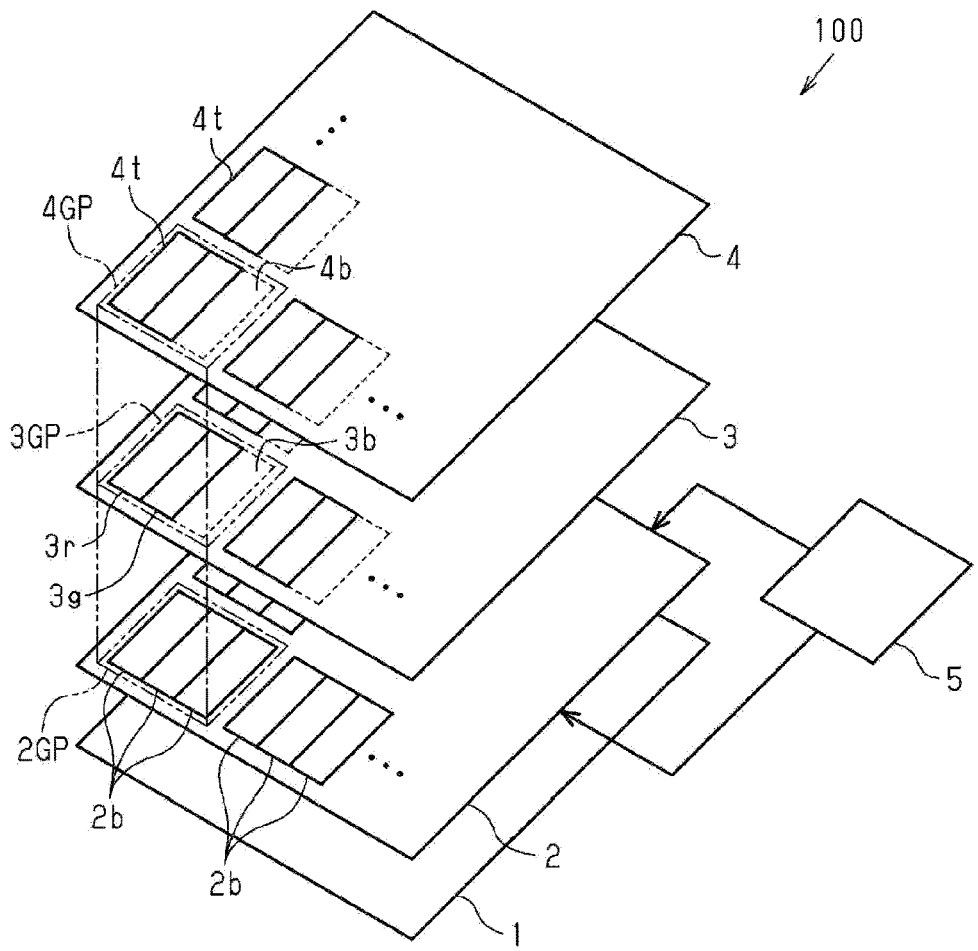
FIG. 17 illustrates the layer structure of a display device according to a third embodiment.
Figure 18:
FIG. 18 illustrates the optical effect of the display device according to the third embodiment.
Figure 18:
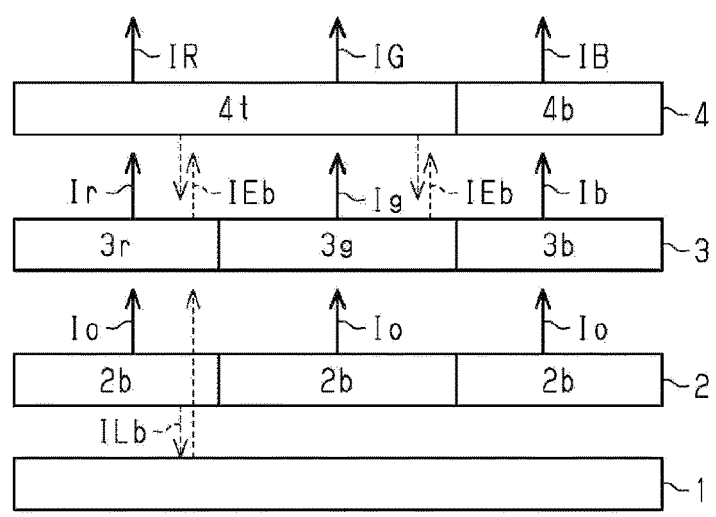

As shown in FIG. 17, a display device 100 includes a reflective layer 1, a light source layer 2, a wavelength conversion layer 3, a wavelength selection layer 4, and a driving unit 5. The light source layer 2 underlies the wavelength conversion layer 3, and the wavelength conversion layer 3 underlies the wavelength selection layer 4. The reflective layer 1 underlies the light source layer 2, that is, lies on the side opposite to the wavelength conversion layer 3 with respect to the light source layer 2. The driving unit 5 is connected to the light source layer 2. Relative to the light source layer 2, the position of the wavelength selection layer 4 is the front of the display device 100. Relative to the light source layer 2, the position of the reflective layer 1 is the rear of the display device 100. An observer of the display device 100 views the display device 100 from a position facing the wavelength selection layer 4.

The wavelength conversion layer 3 includes a plurality of pixels 3GP. The pixels 3GP each include three subpixels: a red subpixel 3r, a green subpixel 3g, and a blue subpixel 3b. In each pixel 3GP, the three subpixels 3r, 3g, and 3b are arranged in a predetermined order. The red subpixel 3r and the green subpixel 3g are preferably adjacent to each other. The plurality of pixels 3GP are arranged in, for example, a matrix form. In accordance with the arrangement of the pixels 3GP, the three subpixels 3r, 3g, and 3b are also arranged in the predetermined order repeatedly.

The red subpixel 3r serves as a red wavelength-conversion section, and converts blue light into red light and emits the resultant light. The green subpixel 3g serves as a green wavelength-conversion section, and converts blue light into green light and emits the resultant light. The blue subpixel 3b serves as a blue-transparent section and allows blue light to be transmitted therethrough. In the present embodiment, blue light is light having an intensity peak within the blue wavelength range, which is a wavelength range of 400 nm or more and 500 nm or less (light at a first wavelength). Green light is light having an intensity peak within the green wavelength range, which is a wavelength range of 520 nm or more and 580 nm or less (light at a third wavelength). Red light is light having an intensity peak within the red wavelength range, which is a wavelength range of 600 nm or more and 700 nm or less (light at a second wavelength).

For light color conversion in the wavelength conversion layer 3, that is, wavelength conversion, quantum dots are preferably used because the resultant wavelength after conversion will have high monochromaticity. More specifically, the red subpixel 3r and the green subpixel 3g contain dispersed quantum dots. The quantum dots contained in the red subpixel 3r have a particle size adjusted to absorb blue light and emit red light. The quantum dots contained in the green subpixel 3g have a particle size adjusted to absorb blue light and emit green light. The blue subpixel 3b may not necessarily contain quantum dots, but may be formed from a material that allows blue light to be transmitted therethrough.

The wavelength of light may also be converted in the wavelength conversion layer 3 using a fluorescent substance different from quantum dots. In this case, the red subpixel 3r contains a fluorescent substance that absorbs blue light and emits red light. The green subpixel 3g contains a fluorescent substance that absorbs blue light and emits green light. The blue subpixel 3b may not necessarily contain a fluorescent substance, but may be formed from a material that allows blue light to be transmitted therethrough.

In short, the red subpixel 3r may be configured to emit red light in response to an energy state transition caused by blue light serving as excitation light. The green subpixel 3g may be configured to emit green light in response to an energy state transition caused by blue light serving as excitation light. The blue subpixel 3b may be configured to allow blue light to be transmitted therethrough.

The light source layer 2 includes a plurality of light emitting sections 2b that emit blue light. The plurality of light emitting sections 2b are arranged with each light emitting section 2b facing one subpixel 3r, 3g, or 3b. That is, one pixel 3GP faces a unit area 2GP in which three light emitting sections 2b (a first light emitting section, a second light emitting section, and a third light emitting section) are arranged. The plurality of light emitting sections 2b are arranged in a manner that aligns a plurality of unit areas 2GP with the plurality of pixels 3GP.

Each light emitting section 2b may include any light emitting element that emits blue light. The light emitting element is preferably a blue light emitting diode, and more preferably an organic light emitting diode because of their capability of emitting highly monochromatic blue light and being driven at low power.

The light emitting sections 2b connect with the driving unit 5 in a manner that allows the light emissions from the light emitting sections 2b to be controlled independently of each other. The driving unit 5 includes a circuit that produces signals for controlling the presence or absence of light emission and the intensity of light emission from the light emitting sections 2b in accordance with data for image to be displayed on the display device 100. The driving unit 5 feeds the signals produced by the circuit to each light emitting section 2b.

The wavelength selection layer 4 includes a plurality of filter sections 4t and a plurality of transparent sections 4b. The filter sections 4t are positioned in a manner to face the red subpixels 3r and the green subpixels 3g, whereas the transparent sections 4b are positioned in a manner to face the blue subpixels 3b. That is, one pixel 3GP faces a unit area 4GP in which one filter section 4t and one transparent section 4b are arranged. The plurality of filter sections 4t and the plurality of transparent sections 4b are arranged in a manner that aligns a plurality of unit areas 4GP with the plurality of pixels 3GP.

The filter sections 4t serve as red wavelength selecting sections and green wavelength selecting sections, and allow red light and green light to be transmitted therethrough while reflecting blue light. The transparent sections 4b serve as blue-transparent sections and allow blue light to be transmitted therethrough.

More specifically, the filter sections 4t transmit 70% or more of each of the red light emitted from the red subpixels 3r in their wavelength range and the green light emitted from the green subpixels 3g in their wavelength range, while reflecting 70% or more of the blue light emitted from the light emitting sections 2b in their wavelength range. For example, each filter section 4t may be configured to have a light transmittivity that allows the transmission of 70% or more of the light in the above red wavelength range and the above green wavelength range as well as a light reflectance that allows the reflection of 70% or more of the light in the above blue wavelength range. The transparent sections 4b transmit 70% or more of the blue light emitted from the light emitting sections 2b in their wavelength range. For example, each transparent section 4b may be configured to have a light transmittivity that allows the transmission of 70% or more of the light in the above blue wavelength range. The transparent section 4b may or may not necessarily transmit light other than in the blue wavelength range.

The filter section 4t has a laminated structure of a plurality of layers transparent to light in each of the red, the green, and the blue wavelength ranges. The plurality of layers include layers having different refractive indexes and adjacent to each other. The refractive index difference causes an optical phenomenon such as reflection, which provides the wavelength selectivity of the filter section 4t. The layers having different refractive indexes and to each other preferably have, in the visible range, a refractive index difference of 0.05 or more. The specific structure of the wavelength selection layer 4 including the filter section 4t will be described later.

The reflective layer 1 faces the light emitting sections 2b and reflects blue light. The reflective layer 1, for example, reflects 70% or more of the blue light emitted from the light emitting sections 2b in their wavelength range. The reflective layer 1 may be configured to reflect light in at least the above blue wavelength range, and preferably reflect light in each of the red, the green, and the blue wavelength ranges.

[Effect of Display Device]

The optical effect caused in the display device 100 will now be described with reference to FIG. 18.

First, the light emitting sections 2b of the light source layer 2 emit blue light Io to the subpixels 3r, 3g, and 3b facing the light emitting sections 2b in accordance with signals from the driving unit 5. The red subpixels 3r absorb the incident blue light Io and emit red light Ir to the filter sections 4t facing the red subpixels 3r. The green subpixels 3g absorb the incident blue light Io and emit green light Ig to the filter sections 4t facing the green subpixels 3g. The blue subpixels 3b transmit the incident blue light Io and emit blue light Ib to the transparent sections 4b facing the blue subpixels 3b.

The filter sections 4t of the wavelength selection layer 4 allow the incident red light Ir from the red subpixels 3r to be transmitted therethrough and emerge to the front as red light IR. The filter sections 4t also allow the incident green light Ig from the green subpixels 3g to be transmitted therethrough and emerge to the front as green light IG. The transparent sections 4b of the wavelength selection layer 4 allow the incident blue light Ib from the blue subpixels 3b to be transmitted therethrough and emerge to the front as blue light IB.

As a result, an observer Ob of the display device 100 visually recognizes the red light IR emerging from the areas corresponding to the red subpixels 3r, the green light IG emerging from the areas corresponding to the green subpixels 3g, and the blue light IB emerging from the areas corresponding to the blue subpixels 3b. The driving unit 5 controls the presence or absence of light emission and the intensity of light emission from each light emitting section 2b, and thus the colors visible at the pixels 3GP are controlled. The set of the pixels 3GP form an image displayed on the display device 100.

The red subpixels 3r may emit light including the red light Ir as well as blue light IEb that has been emitted from the light emitting sections 2b and transmitted through the red subpixels 3r without undergoing wavelength conversion. The green subpixels 3g may emit light including the green light Ig as well as blue light IEb that has been emitted from the light emitting sections 2b and transmitted through the green subpixels 3g without undergoing wavelength conversion.

The filter sections 4t, which allow red light and green light to be transmitted therethrough, reflect blue light. Thus, the blue light IEb emerging from the red subpixels 3r is reflected by the filter sections 4t back to the rear side, and the blue light IEb emerging from the green subpixels 3g is also reflected by the filter sections 4t back to the rear side. This prevents the blue light IEb from emerging to the front of the wavelength selection layer 4 from the areas corresponding to the red subpixels 3r and the green subpixels 3g.

The observer Ob is thus prevented from visually recognizing light mixed with light having a color different from the red light Ir on the red subpixels 3r, and also light mixed with light having a color different from the green light Ig on the green subpixels 3g. As a result, the areas corresponding to the subpixels 3r, 3g, and 3b provide clear colors, preventing an image displayed on the display device 100 from having tints different from the correct tints, that is, avoiding color mixture in the displayed image.

Blue light ILb escaping past the light source layer 2 toward the rear side is reflected by the reflective layer 1 and enters the wavelength conversion layer 3. This reduces a certain percentage of light unused in the wavelength conversion layer 3 from the light emitted by the light emitting section 2b, thus improving the efficiency of generation of light IR, IG, and IB emerging from the display device 100.

The blue light IEb reflected by the filter sections 4t enters the red subpixels 3r or the green subpixels 3g and is used for the generation of the red light Ir or the green light Ig. In particular, if the reflective layer 1 is capable of reflecting light in every wavelength range, light emerging from the red subpixels 3r and the green subpixels 3g toward the rear side in response to the blue light IEb reflected by the filter sections 4t and serving as excitation light will also be reflected to the front side by the reflective layer 1. This also improves the efficiency of generation of light IR, IG, and IB emerging from the display device 100.

[Configuration of Wavelength Selection Layer]

In an example of the structure of the wavelength selection layer 4, each filter section 4t preferably has the structure of the wavelength selection filter according to one of the first embodiment, the second embodiment, and the modification thereof. The wavelength selection filter used for the filter section 4t is placed with its front surface or the rear surface facing the wavelength conversion layer 3.

For the filter section 4t having the above wavelength selection filter, the material for the high refractive index layer 18 preferably has a refractive index of 1.6 or more, and the materials for the projection-depression structure layer 17 and the filling layer 19 preferably have a refractive index of 1.5 or less. The first period P1, which is the grating structure period of the first grating region 13, is the same as the second period P2, which is the grating structure period of the second grating region 15. In the use of the wavelength selection filter according to the second embodiment, the plurality of resonant structures 21 have the same structure period Pk.

In the above wavelength selection filter, the first period P1, the second period P2, and the thicknesses of the grating regions 13 and 15 are set so that the first grating region 13 and the second grating region 15 allow resonance to be produced in the blue wavelength range. The resulting wavelength selection filter 10 serves as the filter section 4t that reflects blue light and allows red light and green light to be transmitted therethrough.

The first grating region 13 and the second grating region 15 may be configured to reflect the entire blue wavelength range by matching the wavelength range in which light produces resonance in the first grating region 13 and the wavelength range in which light produces resonance in the second grating region 15. The first grating region 13 and the second grating region 15 preferably have closer resonance wavelength ranges. If the ratio of the optical film thickness OT2 of the second grating region 15 to the optical film thickness OT1 of the first grating region 13 (OT2/OT1) is 0.7 or more and 1.3 or less, the filter section 4t allows blue light that is reflected light to have good intensity. The first grating region 13 and the second grating region 15 having closer resonance wavelength ranges tend to easily prevent blue light from leaking out into the front, and increase the intensity of blue light emerging as reflected light. Thus, the use of the reflected light as excitation light in the wavelength conversion layer 3 improves the efficiency of generation of light emerging from the display device 100.

Each transparent section 4b of the wavelength selection layer 4 may have a layer structure similar to that of the filter section 4t with the projection-depression structure layer 17 having a flat surface without projections or depressions. In this case, the transparent section 4b has no subwavelength grating and allows blue light to be transmitted therethrough. Alternatively, the transparent section 4b may be configured to allow blue light to be transmitted therethrough with a layer structure different from that of the filter section 4t.

Although the elements forming each subwavelength grating in the first embodiment and the second embodiment are arranged in the form of a two-dimensional lattice, the filter section 4t may have a wavelength selection filter in which the elements forming each subwavelength grating extend in a strip shape in the second direction or the third direction. That is, the wavelength selection filter may have a subwavelength grating in the arrangement of a one-dimensional lattice. Such a wavelength selection filter can also produce guided-mode resonance.

If each second high refractive index section 15a is as large as the top surface of a projection 17a in a plan view, the projections 17a of the projection-depression structure layer 17 may have an area ratio of 0.5 in a plan view. In this case, the area ratio R1 of the first high refractive index section 13a and the area ratio R2 of the second high refractive index sections 15a are each 0.5. In addition, the high refractive index layer 18 may not necessarily include the side high refractive index sections 14a.

Figure 19:
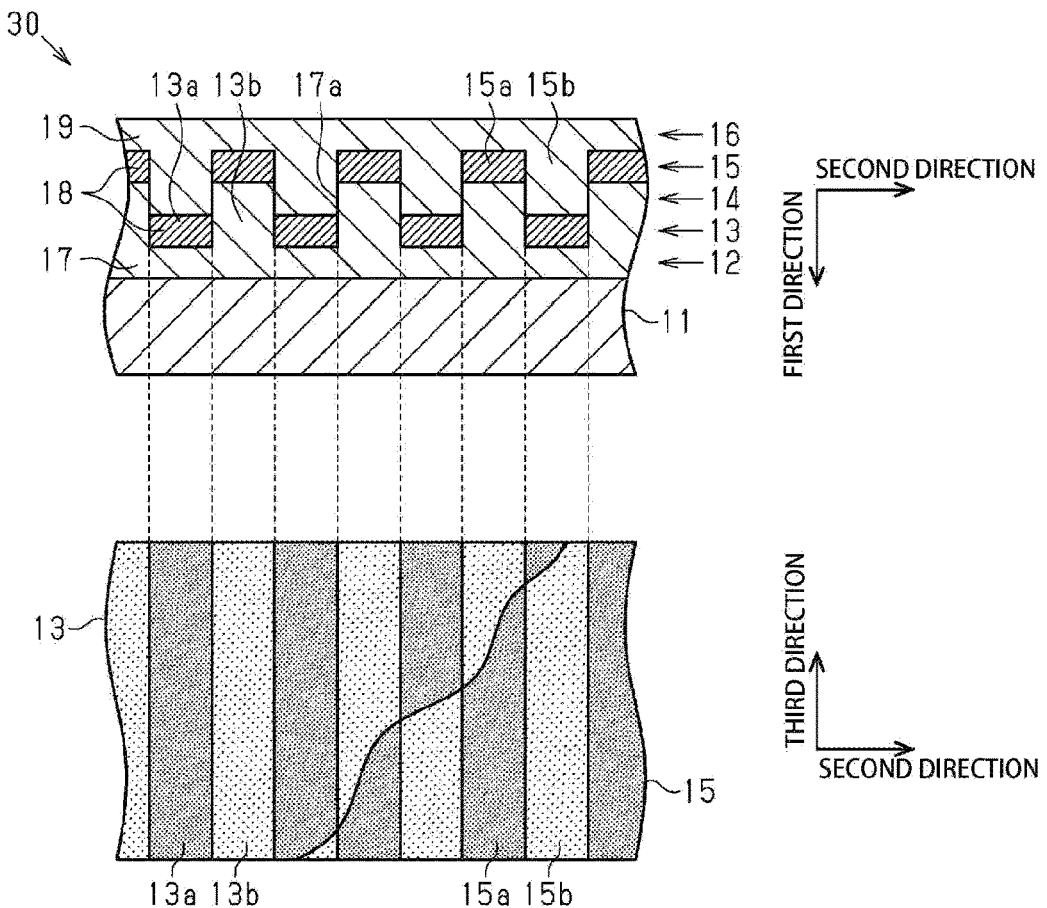
FIG. 19 illustrates a cross-sectional structure of another example of the wavelength selection filter according to the third embodiment, together with the cross-sectional structure of its grating regions.

The arrangement in which the elements forming each subwavelength grating extend in a strip shape will now be described with reference to FIG. 19. FIG. 19 illustrates a cross-sectional structure of the wavelength selection filter 30, and a cross-sectional structure of the first grating region 13 and a cross-sectional structure of the second grating region 15 in a partial cutaway view taken in a direction orthogonal to the first direction.

As shown in FIG. 19, in the first grating region 13 of the wavelength selection filter 30, each of first high refractive index sections 13a and first low refractive index sections 13b has a strip shape extending in the third direction as viewed in a direction along the first direction. The first high refractive index sections 13a and the first low refractive index sections 13b are arranged alternately in the second direction. Similarly, the second grating region 15 of the wavelength selection filter 30 includes second high refractive index sections 15a and second low refractive index sections 15b each extending in a strip shape in the third direction as viewed in a direction along the first direction.

The second high refractive index sections 15a and the second low refractive index sections 15b are arranged alternately in the second direction. As viewed in a direction along the first direction, the second high refractive index sections 15a lie over the first low refractive index sections 13b, and the second low refractive index sections 15b lie over the first high refractive index sections 13a. That is, the projection-depression structure layer 17 of the wavelength selection filter 30 includes a plurality of projections 17a extending in one direction, or the third direction, and arranged parallel to one another.

FIG. 19 shows a structure in which the area ratio R1 of the first high refractive index sections 13a and the area ratio R2 of the second high refractive index sections 15a are each 0.5. More specifically, the first high refractive index sections 13a, the first low refractive index sections 13b, the second high refractive index sections 15a, and the second low refractive index sections 15b have the same width in the second direction. However, each of the area ratio R1 of the first high refractive index sections 13a and the area ratio R2 of the second high refractive index sections 15a may not necessarily be 0.5. The second high refractive index sections 15a may have a width greater than the width of the first low refractive index sections 13b, that is, the width of the projections 17a.

In any case, the optical film thickness OT1 of the first grating region 13 and the optical film thickness OT2 of the second grating region 15 calculated using equations (2) and (4) in the first embodiment need to meet the condition that the ratio of the optical film thickness OT2 to the optical film thickness OT1 is 0.7 or more and 1.3 or less.

Although FIG. 19 shows a structure in which the high refractive index layer 18 includes no side high refractive index sections 14a, that is, a structure in which the intermediate region 14 has no side high refractive index sections 14a, the intermediate region 14 may have the side high refractive index sections 14a. With the intermediate region 14 having the side high refractive index sections 14a, the area ratio R3 of the side high refractive index sections 14a will preferably meet equation (5) in the first embodiment.

Also in cases where the filter section 4t has a wavelength selection filter including a plurality of resonant structures 21 as in the second embodiment, the elements forming each subwavelength grating may extend in a strip shape. For a wavelength selection filter including two resonant structures 21, in each of which the elements forming each subwavelength grating extend in a strip shape, the elements forming the subwavelength gratings in the two resonant structures 21A and 21B are preferably arranged in orthogonal directions. For example, it is preferable that the elements in the resonant structure 21A extend in the second direction, and the elements in the resonant structure 21B extend in the third direction. This configuration enables the resonance of light polarized in different directions in accordance with the arrangement directions. Thus, incident light containing polarization components in various directions results in the emergence of reflected light corresponding to the polarization components for the plurality of directions. This prevents blue light from leaking out into the front and also increases the intensity of the reflected light.

In the grating regions 13 and 15, light polarized in a particular direction that depends on the arrangement direction of the elements forming each subwavelength grating is multiply reflected to produce resonance in the arrangement direction, and emerges as reflected light. A structure with the arrangement direction being a plurality of directions as in the case where the elements are arranged in the form of a two-dimensional lattice enables the resonance of light polarized in different directions in accordance with the arrangement directions. Thus, in comparison between a structure with the arrangement direction being one direction as in the case where the elements extend in one direction, and a structure with the arrangement direction being a plurality of directions, the structure with the arrangement direction being a plurality of directions is found to enable reflected light to emerge more efficiently, in response to incident light containing polarization components in various directions like light emitted from a light emitting diode. This prevents blue light from leaking out into the front and also increases the intensity of the reflected light.

In particular, the elements arranged in the form of a hexagonal lattice will allow the grating regions 13 and 15 to have more directions in which polarized light can produce resonance than the elements arranged in the form of a tetragonal lattice. Thus, reflected light can emerge more efficiently in response to incident light containing polarization components in various directions.

[Other Forms of Wavelength Selection Layer]

Although the wavelength selection filters illustrated above each include a plurality of subwavelength gratings, the filter section 4t may have a wavelength selection filter including a single subwavelength grating.

Figure 20:
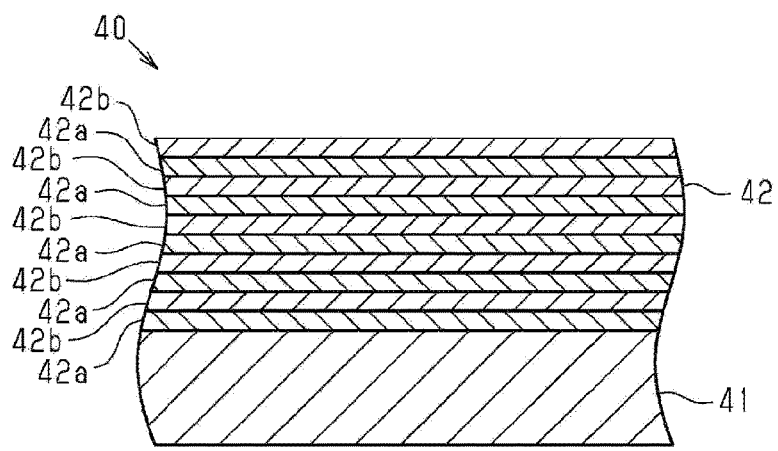
FIG. 20 illustrates a cross-sectional structure of still another example of the wavelength selection filter according to the third embodiment.

The filter section 4t may also be configured to allow red light and green light to be transmitted therethrough while reflecting blue light by using multilayer interference in place of guided-mode resonance. More specifically, as shown in FIG. 20, the filter section 4t has a wavelength selection filter 40 including a substrate 41 and a multilayer film 42 which is a laminate of a plurality of dielectric thin films. The multilayer film 42 has a structure in which high refractive index layers 42a and low refractive index layers 42b are laminated alternately. The substrate 41, the high refractive index layers 42a, and the low refractive index layers 42b are formed from materials transparent to the wavelength ranges of red, green, and blue light. The materials for the layers are not limited to particular materials as long as the high refractive index layers 42a have a refractive index higher than the refractive index of the low refractive index layers 42b. However, as the refractive index difference widens between the high refractive index layers 42a and the low refractive index layers 42b, the number of layers required to achieve a higher intensity of reflected light decreases. For example, when the high refractive index layers 42a and the low refractive index layers 42b are formed from inorganic materials, the high refractive index layers 42a are formed from titanium dioxide, whereas the low refractive index layers 42b are formed from silicon dioxide. The substrate 41 may be, for example, a resin film.

When light is incident on the filter section 4t, the light is reflected by the interfaces between the high refractive index layers and the low refractive index layers and causes interference. As a result, light in a specific wavelength range is reflected. The filter section 4t is configured to have a light reflectance in the blue wavelength range higher than the reflectance in the other wavelength ranges by designing the thickness of each of the high refractive index layers and the low refractive index layers using the transfer matrix method.

For the filter section 4t including a multilayer film, the transparent section 4b of the wavelength selection layer 4 may be an air layer or filled with, for example, a resin material serving as a protective layer over the wavelength selection layer 4 or an adhesive layer for laminating the protective layer. In short, the transparent section 4b may have any configuration that allows blue light to be transmitted therethrough.

A filter section 4t with a structure that uses guided-mode resonance is easier to manufacture because of the smaller number of layers forming the filter section 4t. However, the filter section 4t including a multilayer film also has the advantages of high flexibility to adjust the wavelength range of emerging reflected light and small changes in the color of reflected light at varying observation angles.

According to the third embodiment, the advantageous effects enumerated below are achieved.

(21) The arrangement of the filter section 4t over the red subpixel 3r and the green subpixel 3g reduces blue light mixture into light emerging to the front of the display device 100 over the red subpixel 3r and the green subpixel 3g. This reduces color mixture in an image formed by using light emerging through the wavelength selection layer 4.

(22) The blue subpixel 3b and the transparent section 4b allow blue light from the light emitting section 2b to be transmitted therethrough, so that blue light emitted from the light emitting section 2b, red light emerging from the red subpixel 3r, and green light emerging from the green subpixel 3g are used to generate an image. This achieves color display with color mixture reduced suitably.

(23) The filter section 4t has the same structure and the same wavelength selectivity over the red subpixel 3r and the green subpixel 3g. This can simplify the structure of the display device 100 compared with filter sections 4t having different structures and different wavelength selectivities over the red subpixel 3r and the green subpixel 3g.

(24) The filter section 4t is a laminate of a plurality of layers transparent to the red, the green, and the blue wavelength ranges. The plurality of layers include layers having different refractive indexes and adjacent to each other. In this configuration, the refractive index difference causes an optical phenomenon, which provides the wavelength selectivity of the filter section 4t.

(25) If the filter section 4t includes a projection-depression structure layer 17 having a projection-depression structure in the surface with an arrangement of a subwavelength period, and a high refractive index layer 18 having a shape following the projection-depression structure of the projection-depression structure layer 17, guided-mode resonance achieves the filter section 4t that reflects blue light. This allows reflected light to be acquired with a high wavelength selectivity and also a higher intensity. The projections and depressions of the high refractive index layer 18 are filled by the filling layer 19, and thus the two subwavelength gratings are filled by the low refractive index material. As a result, the intensity of reflected light is further increased.

(26) If the projection-depression structure layer 17 of the filter section 4t includes a plurality of projection-depression elements extending in one direction and arranged parallel to one another, the projection-depression structure of the projection-depression structure layer 17 is easier to form precisely than projection-depression elements arranged in the form of a two-dimensional lattice.

(27) If the projection-depression structure layer 17 of the filter section 4t includes a plurality of projection-depression elements arranged in the form of a two-dimensional lattice, incident light containing polarization components in various directions results in the emergence of reflected light corresponding to the polarization components for the plurality of directions. This prevents blue light from leaking out into the front and also increases the intensity of the reflected light.

(28) If the filter section 4t includes a plurality of resonant structures 21, the filter section 4t has four or more subwavelength gratings, thus enabling increases in the intensity of reflected light and the responsivity to polarization.

(29) If the red subpixel 3r and the green subpixel 3g have at least one of fluorescent substance or quantum dots that use blue light as excitation light, wavelength conversion that uses excitation can be achieved in an appropriate manner. In particular, if the red subpixel 3r and the green subpixel 3g have quantum dots, the resultant light after conversion will be highly monochromatic light.

(30) If the light emitting section 2b has a blue light emitting diode, highly monochromatic light can be emitted and driven at low power.

(31) Since the display device 100 includes the reflective layer 1, blue light leaking downward from the light emitting section 2b is reflected and used for wavelength conversion and image display. This improves the efficiency of generating color light used for image display on the display device 100.

Modification of Third Embodiment

The above third embodiment may be modified and implemented as described below.

In the third embodiment, the filter section 4t placed over the red subpixel 3r and the filter section 4t placed over the green subpixel 3g have the same structure and are continuous with each other, with the same wavelength selectivity, that is, the same reflectance properties and transmission properties. Instead, the filter section 4t placed over the red subpixel 3r and the filter section 4t placed over the green subpixel 3g may have different structures, with wavelength selectivities different from each other. For example, the filter section 4t placed over the red subpixel 3r is any filter that reflects at least blue light and allows red light to be transmitted therethrough, and may reflect green light together with blue light. The filter section 4t placed over the green subpixel 3g is any filter that reflects at least blue light and allows green light to be transmitted therethrough, and may reflect red light together with blue light.

For example, in a wavelength selection filter including two resonant structures 21, the two resonant structures 21A and 21B are configured to have structure periods Pk different from each other. In the grating regions 13 and 15 of the first resonant structure 21A, blue light is set to produce resonance. In the grating regions 13 and 15 of the second resonant structure 21B, green light is set to produce resonance. This configuration provides the filter section 4t that reflects blue light and green light and allows red light to be transmitted therethrough.

If the red subpixel 3r and the green subpixel 3g have a difference in blue light transmittance, the filter section 4t may be placed only over the red subpixel 3r or only over the green subpixel 3g. In addition, the colors of subpixels included in the display device 100 may not necessarily be the three colors: red, green, and blue. The light emitting section 2b may emit light of a color different from blue. In summary, the wavelength conversion layer 3 allows light at a first wavelength included in light emitted from the light emitting section 2b to be used as excitation light for emission of light at a second wavelength longer than the first wavelength, and the wavelength selection layer 4 allows the light at the first wavelength to be reflected and the light at the second wavelength to be transmitted. In this structure, at least the region for such wavelength selection can avoid color mixture in an image caused by the intrusion of light from the light emitting section 2b.

Example

The above-described wavelength selection filter according to the second embodiment and a method of manufacturing the wavelength selection filter will be described by way of a specific example.

<Manufacture of Wavelength Selection Filter>

First, a mold was prepared as an intaglio plate for use in photo-nanoimprinting. More specifically, light at a wavelength of 365 nm was used as irradiation light in the photo-nanoimprinting, and thus synthetic quartz capable of transmitting light at this wavelength was used as the material for the mold. In the formation of the mold, a film made of Cr was first formed by sputtering on the surface of a synthetic quartz substrate, and an electron beam resist pattern was formed on the Cr film by electron-beam lithography. The resist used was a positive type, and the film thickness was set to 150 nm. In the pattern imaged with an electron beam, squares of side 210 nm were arranged in the form of a tetragonal lattice at a period of 300 nm in the region of a square of side 3 cm. The area imaged with the electron beam was the inside area of the above square. Next, the Cr film in the region exposed from the resist was etched by plasma generated by applying a high frequency to a mixed gas of chlorine and oxygen. Subsequently, the synthetic quartz substrate in the region exposed from the resist and the Cr film was etched with plasma generated by applying a high frequency to hexafluoroethane gas. The etched synthetic quartz substrate had a depth of 200 nm. The remaining resist and Cr film were removed, and Optool HD-1100 (manufactured by Daikin Industries, Ltd.) was applied as a mold release agent. As a result, a mold was given with the square region including a two-dimensional lattice pattern formed of the squares arranged in the tetragonal lattice.

Next, an ultraviolet-curing resin was applied to the square region in which the two-dimensional lattice pattern was formed on the mold, and the mold surface was covered with a polyethylene terephthalate film subjected to an adhesion enhancement treatment. The ultraviolet-curing resin was spread out with a roller over the entire square region and cured by irradiation with 365 nm ultraviolet radiation. Then, the polyethylene terephthalate film was removed from the mold. In this way, a laminate was produced including a projection-depression structure layer formed of the UV-cured resin with the two-dimensional lattice pattern formed on its surface, and a substrate which was the polyethylene terephthalate film. This process was repeated to produce two laminates each including the projection-depression structure layer and the substrate. The dose of the 365 nm ultraviolet radiation was 50 mJ/cm2.

Then, a high refractive index layer of TiO2 was formed by coating the surface of each of the two laminates with a TiO2 film 100 nm in thickness using a vacuum deposition method. Subsequently, an ultraviolet-curing resin was applied to the two-dimensional lattice pattern region on the surface of one of the two laminates, and the two laminates were faced toward each other so that the applied ultraviolet-curing resin was in contact with the surface of the other laminate and the regions of the two-dimensional lattice patterns overlap each other. The ultraviolet-curing resin was spread out with the roller over the entire two-dimensional lattice pattern regions and cured by irradiation with 365 nm ultraviolet radiation to form a filling layer. In this way, the wavelength selection filter in the example was obtained. The dose of the 365 nm ultraviolet radiation was 50 mJ/cm2.

<Evaluation of Wavelength Selection Filter>

In reflection spectroscopy performed on the wavelength selection filter in the example, a reflection spectrum having a center wavelength of about 450 nm was observed.

What is claimed is:

1. A wavelength selection filter, comprising:
a projection-depression structure layer having, on a surface thereof, a projection-depression structure including a plurality of projection-depression elements being projections or depressions, the projection-depression elements being spaced from each other at a subwavelength period and arranged in a form of a two-dimensional lattice;
a high refractive index layer positioned on the projection-depression structure and having a surface shape following the projection-depression structure, the high refractive index layer including a first high refractive index section positioned on a bottom of the projection-depression structure and a second high refractive index section positioned on a top of the projection-depression structure; and
a filling layer filling surface projections and depressions of the high refractive index layer, wherein $n1 > n2$, $n1 > n3$, and $R1 + R2 > 1$, a value of $T1 \times \{n1 \times R1 + n2 \times (1-R1)\}$ is a first parameter, a value of $T2 \times \{n1 \times R2 + n3 \times (1-R2)\}$ is a second parameter, and a ratio of the second parameter to the first parameter is 0.7 or more and 1.3 or less,
where T1 is a thickness of the first high refractive index section, T2 is a thickness of the second high refractive index section,
n1 is a refractive index of a material of the high refractive index layer, n2 is a refractive index of a material of the projection-depression structure layer, n3 is a refractive index of a material of the filling layer,
R1 is an area ratio occupied by the first high refractive index section in a cross section including the first high refractive index section and orthogonal to a thickness direction thereof, and R2 is an area ratio occupied by the second high refractive index section in a cross section including the second high refractive index section and orthogonal to a thickness direction thereof.

2. The wavelength selection filter of claim 1, wherein
the high refractive index layer includes a side high refractive index section extending along a side of each of the projection-depression elements between the first high refractive index section and the second high refractive index section, and
when R3 is an area ratio occupied by the side high refractive index section in a cross section including the side high refractive index section and orthogonal to a thickness direction thereof, $R3 \leq R1 + R2 - 1$ is satisfied.

3. The wavelength selection filter of claim 1, wherein
the high refractive index layer includes a side high refractive index section extending along a side of each of the projection-depression elements between the first high refractive index section and the second high refractive index section, and
as viewed in a direction along a thickness direction of the high refractive index layer, the second high refractive index section extends beyond the side high refractive index section.

4. The wavelength selection filter of claim 1, wherein $T1=T2$, $n2=n3$, and $R1=R2$ are satisfied.

5. The wavelength selection filter of claim 1, wherein
the first high refractive index section and the second high refractive index section, and a low refractive index region surrounding the high refractive index sections form a resonant structure, the wavelength selection filter includes a plurality of resonant structures arranged in a thickness direction of the resonant structures,
the plurality of resonant structures comprise a first resonant structure and a second resonant structure, the projection-depression elements in the first resonant structure and the projection-depression elements in the second resonant structure have identical arrangement periods, and
the ratio of the second parameter to the first parameter in the first resonant structure is identical to the ratio of the second parameter to the first parameter in the second resonant structure.

6. A method of manufacturing a wavelength selection filter, the method comprising the steps of:
forming a projection-depression structure layer by forming, on a surface of a layer made of a first low refractive index material, projection-depression elements being a plurality of projections or depressions spaced from each other at a subwavelength period and arranged in a form of a two-dimensional lattice;
forming, along a surface of the projection-depression structure layer, a high refractive index layer from a high refractive index material higher in refractive index than the first low refractive index material, the high refractive index layer including a first high refractive index section positioned on a bottom of a projection-depression structure included in the projection-depression structure layer and a second high refractive index section positioned on a top of the projection-depression structure; and
forming a filling layer by filling surface projections and depressions of the high refractive index layer by using a second low refractive index material lower in refractive index than the high refractive index material, wherein $n1 > n2$, $n1 > n3$, and $R1 + R2 > 1$, a value of $T1 \times \{n1 \times R1 + n2 \times (1-R1)\}$ is a first parameter, a value of $T2 \times \{n1 \times R2 + n3 \times (1-R2)\}$ is a second parameter, and each layer is formed such that a ratio of the second parameter to the first parameter is 0.7 or more and 1.3 or less,
where T1 is a thickness of the first high refractive index section, T2 is a thickness of the second high refractive index section,
n1 is a refractive index of the high refractive index material, n2 is a refractive index of the first low refractive index material, n3 is a refractive index of the second low refractive index material,
R1 is an area ratio occupied by the first high refractive index section in a cross section including the first high refractive index section and orthogonal to a thickness direction thereof, and R2 is an area ratio occupied by the second high refractive index section in a cross section including the second high refractive index section and orthogonal to a thickness direction thereof.

7. The method of manufacturing a wavelength selection filter of claim 6, wherein
the step of forming the high refractive index layer includes forming the high refractive index layer by physical vapor deposition such that the high refractive index layer includes a side high refractive index section extending along a side of each of the projection-depression elements between the first high refractive index section and the second high refractive index section, and as viewed in a direction along a thickness direction of the high refractive index layer, the second high refractive index section extends beyond the side high refractive index section.

* * * * *